(12) United States Patent
Nam et al.

(10) Patent No.: US 11,562,277 B2
(45) Date of Patent: Jan. 24, 2023

(54) USE OF GLOBAL INTERACTIONS IN EFFICIENT QUANTUM CIRCUIT CONSTRUCTIONS

(71) Applicants: University of Maryland, College Park, College Park, MD (US); IonQ, Inc., College Park, MD (US)

(72) Inventors: Yunseong Nam, North Bethesda, MD (US); Dmitri Maslov, Falls Church, VA (US)

(73) Assignee: UNIVERSITY OF MARYLAND, COLLEGE PARK, College Park, MD (US)

( * ) Notice: Subject to any disclaimer, the term of this patent is extended or adjusted under 35 U.S.C. 154(b) by 851 days.

(21) Appl. No.: 16/234,112

(22) Filed: Dec. 27, 2018

(65) Prior Publication Data

US 2019/0205783 A1 Jul. 4, 2019

Related U.S. Application Data

(60) Provisional application No. 62/611,351, filed on Dec. 28, 2017.

(51) Int. Cl.
  *G06N 10/00* (2022.01)
  *G06F 17/14* (2006.01)
  *G06F 15/80* (2006.01)

(52) U.S. Cl.
  CPC ......... *G06N 10/00* (2019.01); *G06F 15/8007* (2013.01); *G06F 17/14* (2013.01)

(58) Field of Classification Search
  CPC ...... G06N 10/00; G06F 15/8007; G06F 17/14
  See application file for complete search history.

(56) References Cited

U.S. PATENT DOCUMENTS

| | | | |
|---|---|---|---|
| 2019/0378033 A1* | 12/2019 | Figgatt | G06F 7/501 |
| 2020/0242502 A1* | 7/2020 | Chen | G06N 10/00 |
| 2021/0035008 A1* | 2/2021 | Gidney | G06N 10/00 |
| 2022/0101169 A1* | 3/2022 | Nam | G06N 10/00 |

OTHER PUBLICATIONS

Debnath, S., et al. Demonstration of a small programmable quantum computer with atomic qubits, Nature, 2016, 10 pages.
Devoret, M.H., et al., Superconducting Circuits for Quantum Information: An Outlook, Science 339, 1169, 2013, 7 pages.
(Continued)

*Primary Examiner* — Stacy Whitmore
(74) *Attorney, Agent, or Firm* — ArentFox Schiff LLP

(57) ABSTRACT

The disclosure describes various aspects of techniques for using global interactions in efficient quantum circuit constructions. More specifically, this disclosure describes ways to use a global entangling operator to efficiently implement circuitry common to a selection of important quantum algorithms. The circuits may be constructed with global Ising entangling gates (e.g., global Mølmer-Sørenson gates or GMS gates) and arbitrary addressable single-qubit gates. Examples of the types of circuits that can be implemented include stabilizer circuits, Toffoli-4 gates, Toffoli-n gates, quantum Fourier transformation (QTF) circuits, and quantum Fourier adder (QFA) circuits. In certain instances, the use of global operations can substantially improve the entangling gate count.

31 Claims, 21 Drawing Sheets

(56) References Cited

OTHER PUBLICATIONS

Sorensen, Anders, et al., Spin-spin interaction and spin-squeezing in an optical lattice, Phys. Rev. Lett., 1999, 4 pages.
Sorensen, Anders, et al., Entanglement and quantum computation with ions in thermal motion, Phys. Rev. A 62, 2000, 11 pages.
Milburn, G.J., et al., Ion trap quantum computing with warm ions, Fortschr. Phys. 48, 2000, 10 pages.
Martinez, Esteban, et al., Compiling quantum algorithms for architectures with multi-qubit gates, New J. Phys. 18 (6), 2016, 11 pages.
Monz, T., et al., Realization of the quantum Toffoli gate with trapped ions, Phys. Rev. Lett. 102, 2009, 11 pages.
Sorensen, Anders, et al., Quantum computation with ions in thermal motion, Phys. Rev. Lett. 82, 1999, 5 pages.
Maslov, Dmitri, Basic circuit compilation techniques for an ion-trap quatum machine, New J. Phys. 19, 2017, 18 pages.
Nigg, Daniel, et al., Experimental Quantum Computations on a Topologically Encoded Qubit, Science 345, 2014, 20 pages.
Zeng, B., et al., Measuring the parity of an N-qubit state, Phys. Rev. Lett. 95, 2005, 4 pages.
Ivanov, Svetoslav, et al., Efficient construction of three- and four-qubit quantum gates by global entangling gates, Physical Review A, Mar. 2015, 9 pages.
Leibfried, D., et al., Efficient eigenvalue determination for arbitrary Pauli products based on generalized spin-spin interactions, 2017, 10 pages.
Nielsen, Michael, et al., Quantum Computation and Quantum Information, Cambridge University Press, 2000, 4 pages.
Raussendorf, R., et al., Topological fault-tolerance in cluster state quantum computation, New J. Phys. 9, 2007, 20 pages.
Bermudez, A., et al., Assessing the progress of trapped-ion processors towards fault-tolerant quantum computation, 2017, 37 pages.
Maslov, Dmitri, et al., Shorter stabilizer cicuits via Bruhat decomposition and quantum circuit transformations, 2017, 10 pages.
Patel, Ketan N., et al., Optimal Synthesis of Linear Reversible Circuits, Quantum Information of Computation 8, 2008, 9 pages.
Lanyon, B.P., et al., Towards Quantum Chemistry on a Quantum Computer, Nature Chemistry, 2009, 20 pages.
Whitfield, James D., et al., Simulation of Electronic Structure Hamiltonians Using Quantum Computers, Molecular Physics, 2011, 22 pages.
Figgatt, C., et al., Complete 3-Qubit Grover Search on a Programmable Quantum Computer, 2017, 11 pages.
Barenco, Adriano, et al., Elementary gates for quantum computation, Physical Review A, vol. 52, No. 5, Nov. 1995, 11 pages.
Maslov, Dmitri, On the advantages of using relative phase Toffolis with an application to multiple control Toffoli optimization, Phys. Rev. A, 2016, 14 pages.
Hess, P.W., et al., Non-thermalization in trapped atomic ion spin chains, 2017, 14 pages.
Beauregard, Siephane, Circuit for Shor's algorithm using 2n+3 qubits, Quantum Information and Computation 3, 2003, 14 pages.
Cuccaro, Steven A., et al., A new quantum ripple-carry addition circuit, 2004, 9 pages.
Nam, Yunseong, et al.. Structural stability of the quantum Fourier transform, Quantum Information Processing, Apr. 2015, 15 pages.
IBM Research Quantum Experience, http://www.research.ibm.com/quantum/, last accessed: May 5, 2017.

\* cited by examiner

USE OF GLOBAL INTERACTIONS IN EFFICIENT QUANTUM CIRCUIT CONSTRUCTIONS

CROSS REFERENCE TO RELATED APPLICATIONS

The present application claims priority to and the benefit of U.S. Provisional Patent Application No. 62/611,351, entitled "USE OF GLOBAL INTERACTIONS IN EFFICIENT QUANTUM CIRCUIT CONSTRUCTIONS," and filed on Dec. 28, 2017, the contents of which are incorporated herein by reference in their entirety.

GOVERNMENT LICENSE RIGHTS

This invention was made with government support under W911NF-16-1-0349 awarded by the Army Research Office (ARO) Multidisciplinary University Research Initiative (MURI). The government has certain rights in the invention.

BACKGROUND OF THE DISCLOSURE

Aspects of the present disclosure generally relate to efficient quantum circuit constructions, and more specifically, to techniques that use global interactions to enable efficient quantum circuit constructions with reduced number of gates.

Trapped atomic ions and superconducting circuits are two examples of quantum information processing (QIP) approaches that have delivered small yet already universal and fully programmable machines. In superconducting circuits qubit interactions are enabled through custom designed electronic hardware involving Josephson junctions and microwave resonators. Different interactions can be controlled individually to invoke the two-qubit gates. A global coupling, however, would not necessarily be natural to such a system, due to the difficulty of placing and connecting $O(n^2)$ individual resonators in the same area as n qubits. One alternative is to couple Josephson junction qubits to a single resonator mode, thereby enabling global interactions. In a trapped ion QIP, on the other hand, global interactions are more naturally realized as an extension of common two-qubit gate interactions. The ability to implement arbitrary selectable two-qubit interactions generally requires a higher level of control, which can be achieved by having individually focused external fields addressing each qubit (e.g., each trapped ion or atom).

Given the ability to implement a global interaction over these two leading QIP approaches, it is desirable to use global entangling gates for efficient (e.g., reduced gate count) quantum circuit constructions, particularly as it applies to the trapped ions technology.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

This disclosure describes ways to use a global entangling operator to efficiently implement circuitry common to a selection of important quantum algorithms. In particular, the disclosure focuses on circuits that can be composed or constructed with global Ising entangling gates and arbitrary addressable single-qubit gates. In some of the scenarios described, the use of global operations can substantially improve the entangling gate count. The techniques described can be technology-independent and therefore apply to any QIP approach (e.g., trapped atomic ions and superconducting circuits), so long as proper global entangling operations are constructible.

This disclosure presents various aspects related to the efficient use of a global entangling operator in realizing quantum circuitry of practical interest. This disclosure describes a number of circuit equalities using global Mølmer-Sørensen (GMS) gates, improving the accessibility of global entangling gates in quantum circuit constructions. Using various versions of the global entangling operator, the advantage in implementing certain kinds of stabilizer circuits, number excitation operator, Toffoli-4 gate, Toffoli-n gate, Quantum Fourier Transformation, and Quantum Fourier Adder circuits is shown. In each of the above, the constructions described outperform best known circuitry in the scenario when the control is given by the two-qubit local addressable gates. As such, the control by a global entangling gate (an analog of single instruction, multiple data classical architecture) could be a helpful complement to the control by addressable two-qubit local gates.

Described herein are methods, apparatuses, and computer-readable storage medium for various aspects associated with the use of global interactions to enable efficient quantum circuit constructions with reduced number of gates.

BRIEF DESCRIPTION OF THE DRAWINGS

The appended drawings illustrate only some implementation and are therefore not to be considered limiting of scope.

single-qubit rotation gates to each respective qubit in accordance with aspects of this disclosure.

Figure 5A:
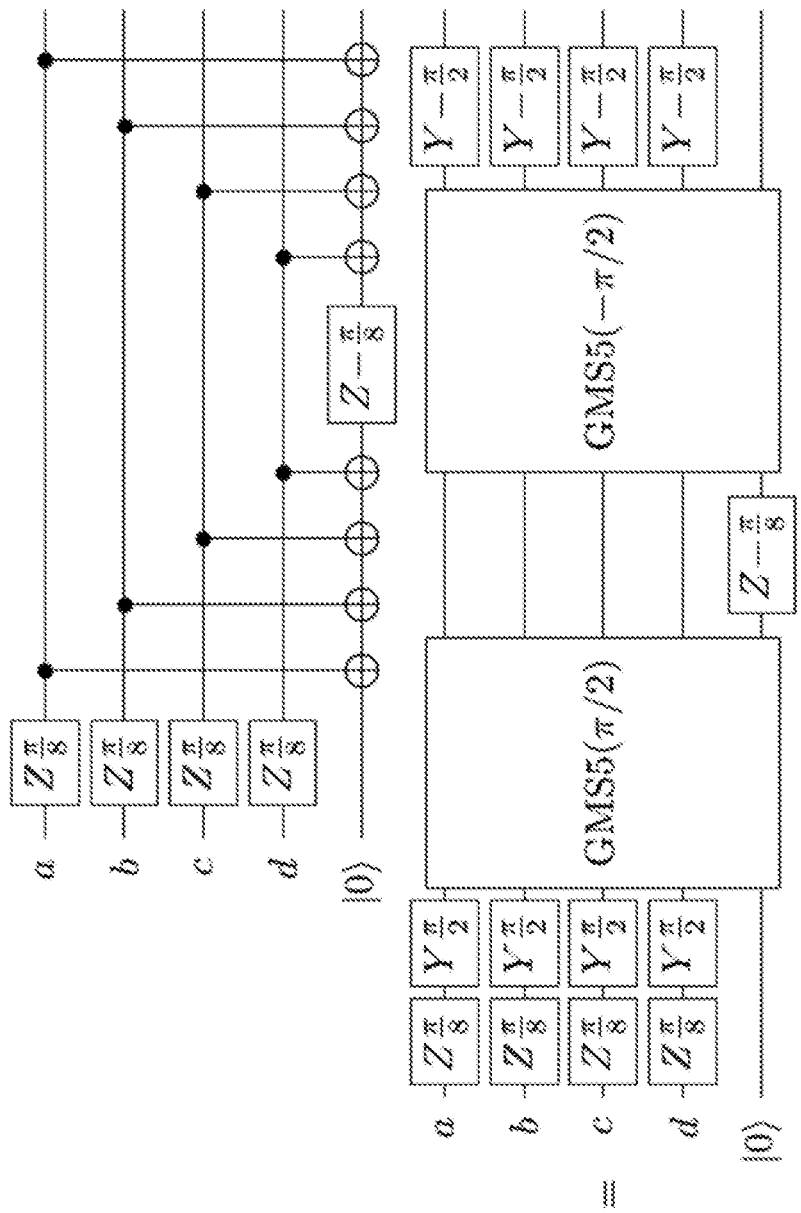

FIG. 5A is a diagram that illustrates an example of obtaining phase $\omega_{16}^{-(a\oplus b\oplus c\oplus d)}$ in accordance with aspects of this disclosure.

Figure 5B:
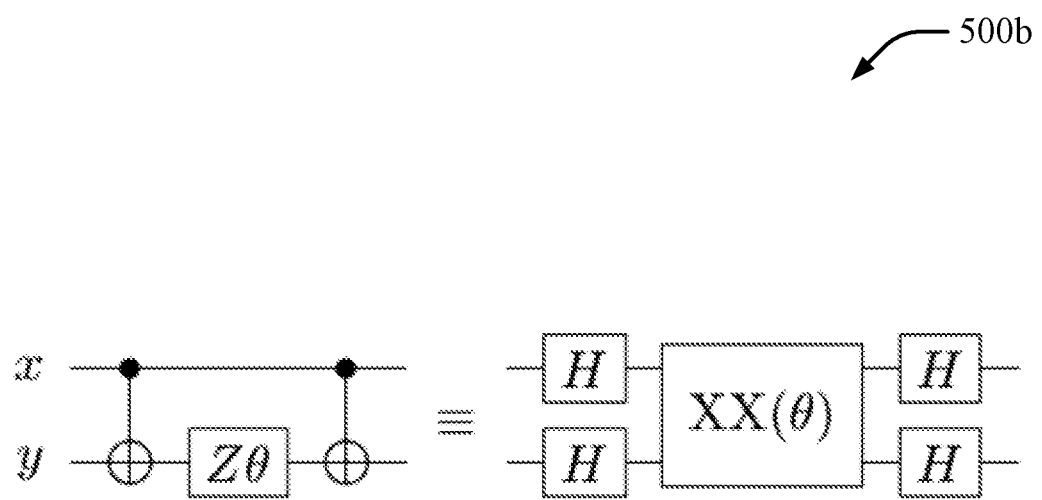

FIG. 5B is a diagram that illustrates an example of a circuit identity useful for obtaining a desired CCCZ gate in accordance with aspects of this disclosure.

Figure 6A:
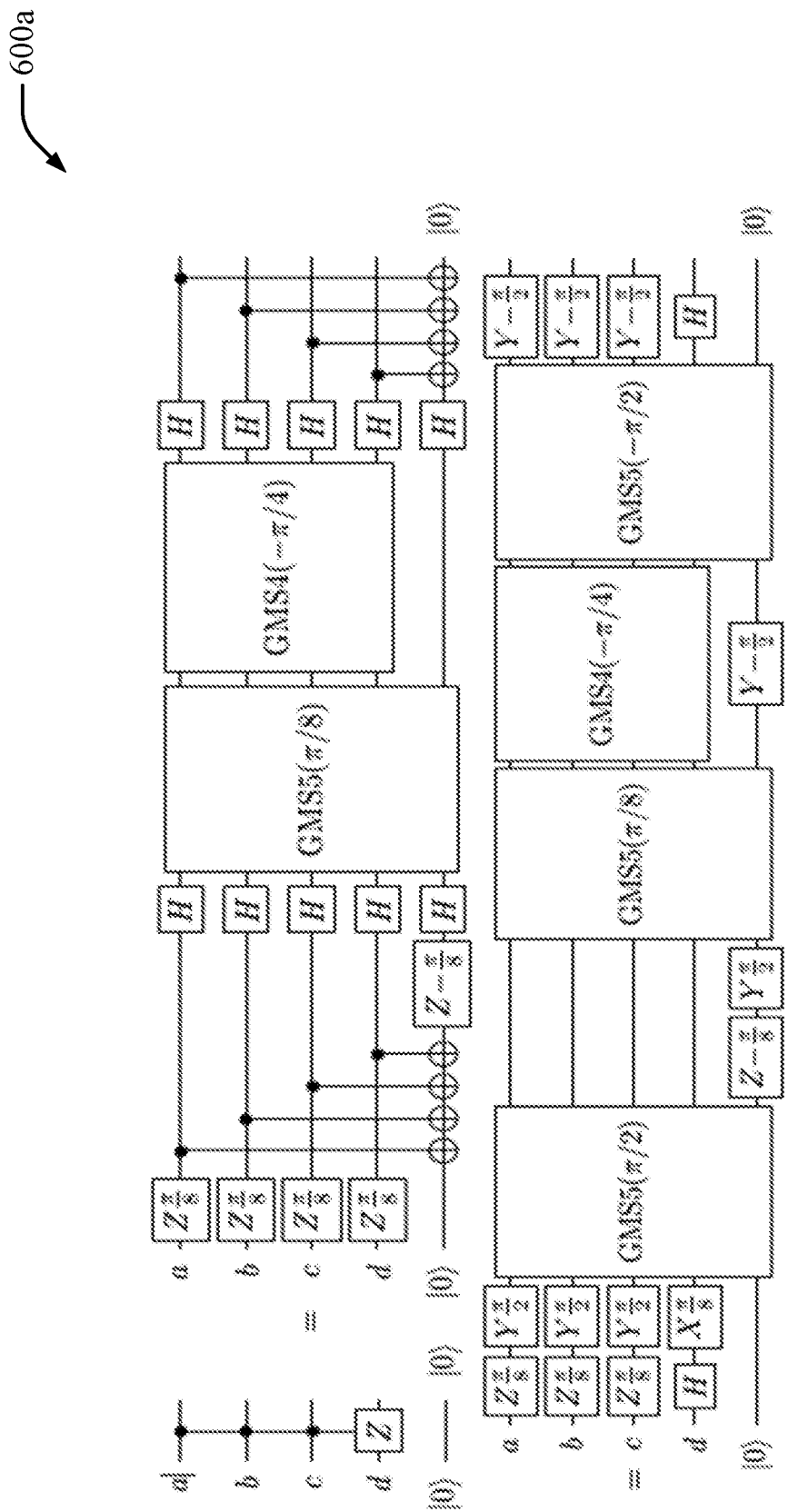

FIG. 6A is a diagram that illustrates an example of a CCCZ gate using four GMS gates in accordance with aspects of this disclosure.

Figure 6B:
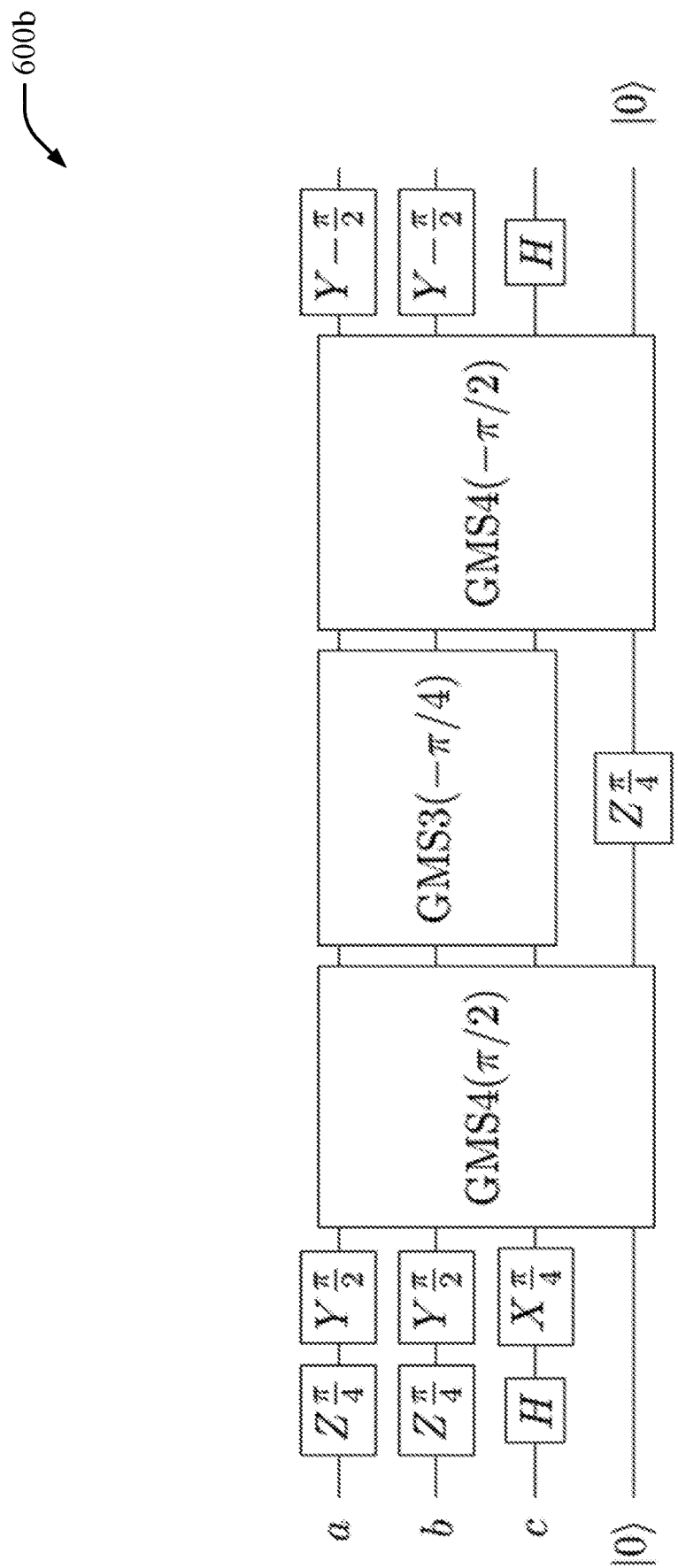

FIG. 6B is a diagram that illustrates an example of a CCZ gate using three GMS gates in accordance with aspects of this disclosure.

Figure 7:
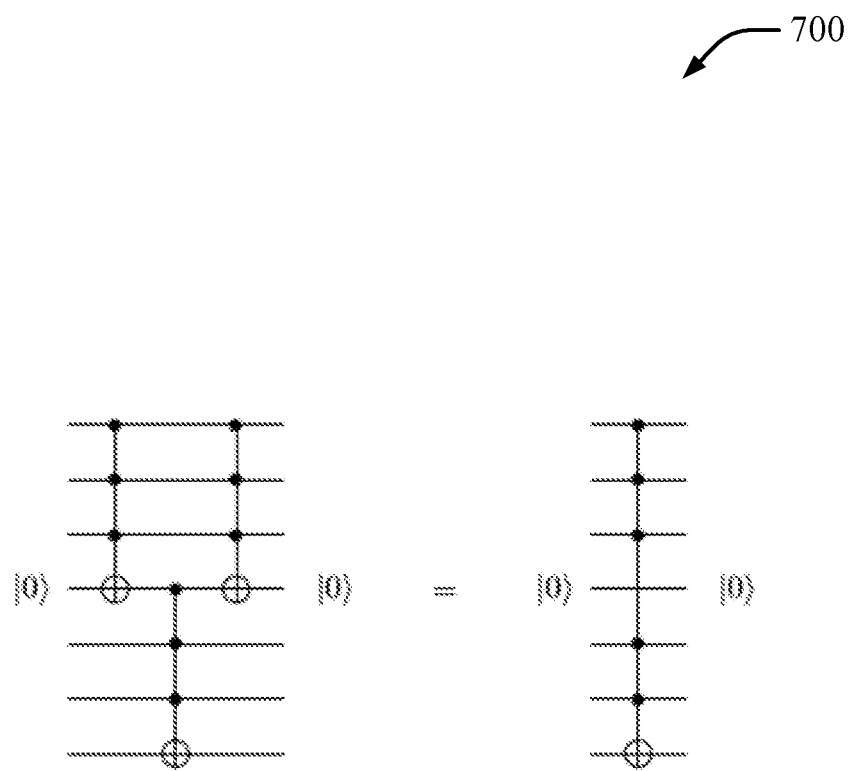

FIG. 7 is a diagram that illustrates an example of ancilla-aided construction of the Toffoli-6 using a set of three Toffoli-4, each of which is constructed using three GMS gates, in accordance with aspects of this disclosure.

Figure 8A:
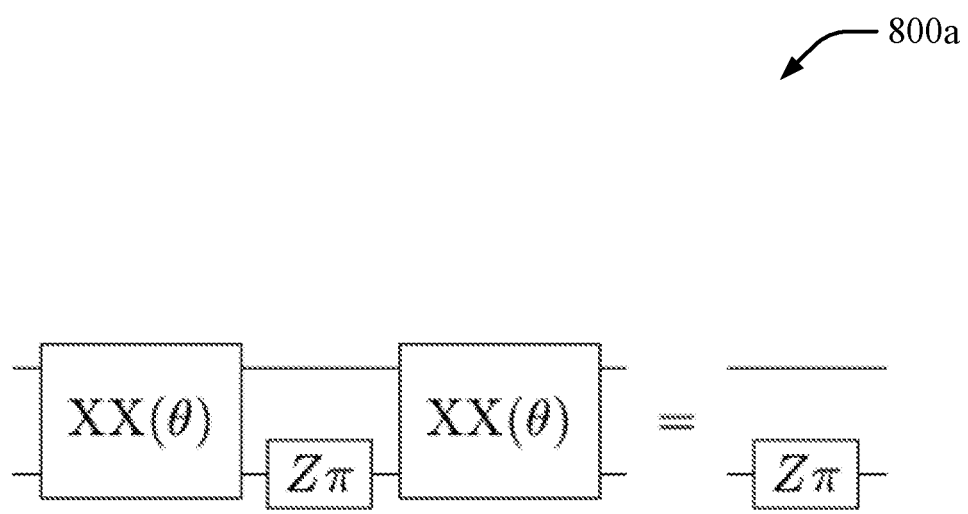
Figure 8B:
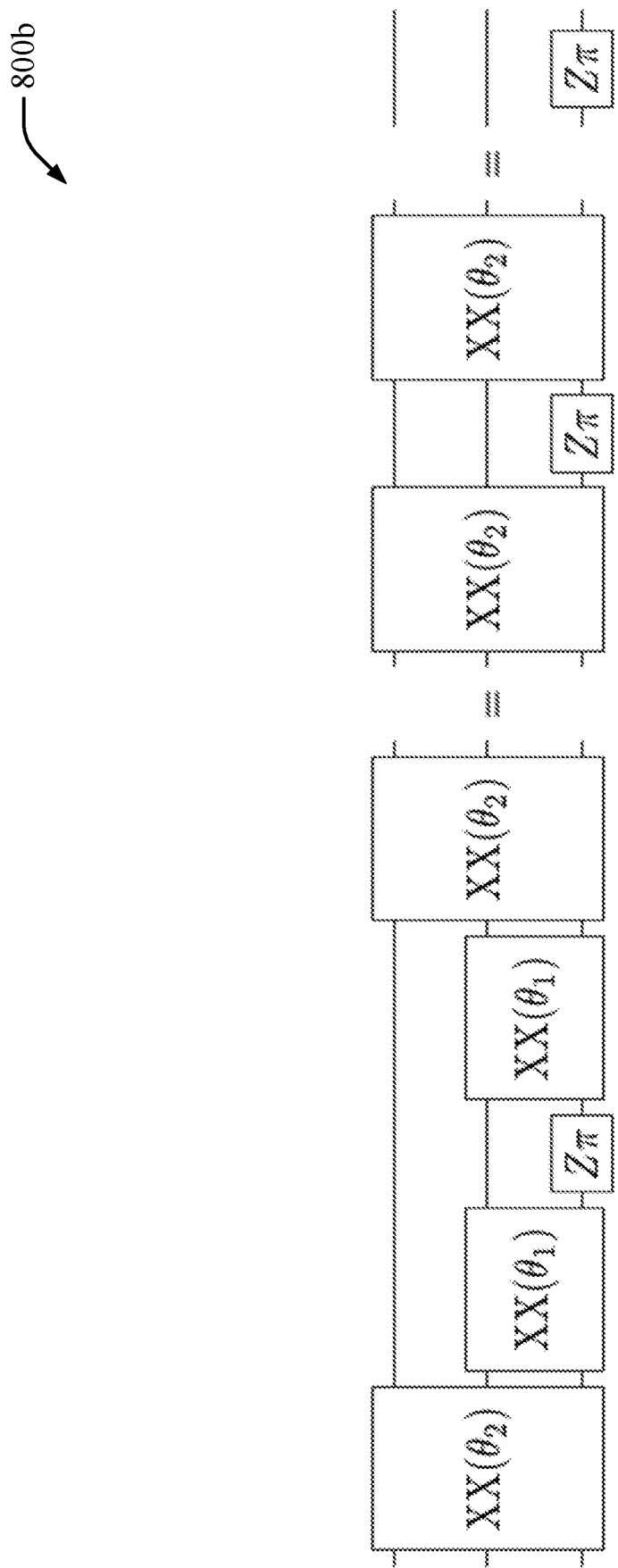

FIGS. 8A and 8B are diagrams illustrating a circuit identity and the recursive application of the circuit identity for use in GMS(n−1) in accordance with aspects of this disclosure.

Figure 8C:
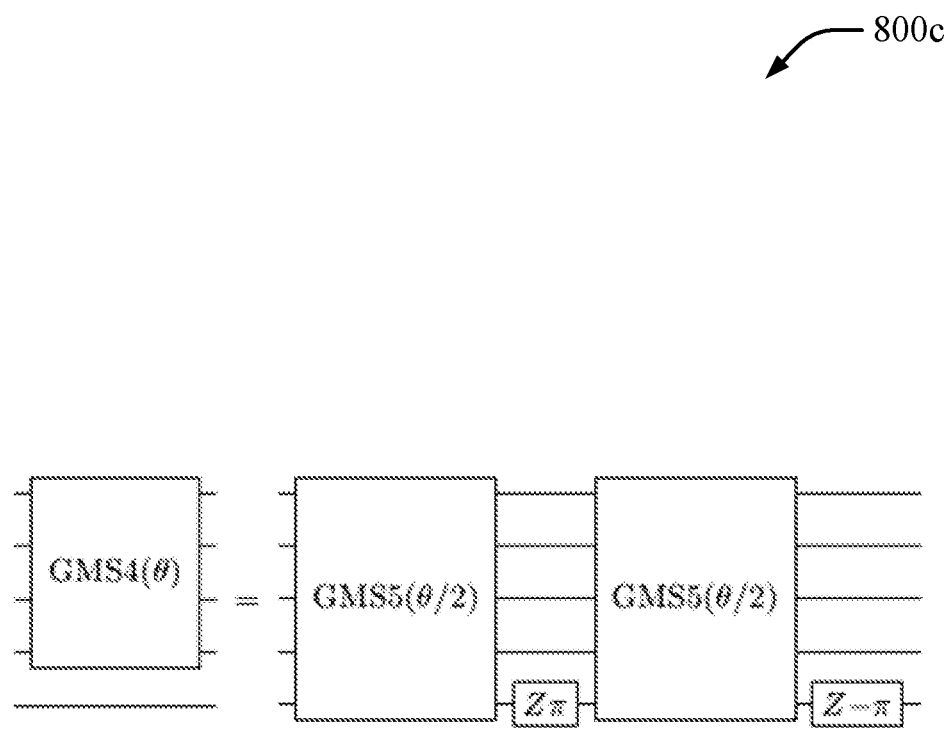

FIG. 8C is a diagram that illustrates an example of GMS(n−1) using two GMSn for the case n=5 in accordance with aspects of this disclosure.

Figure 9:
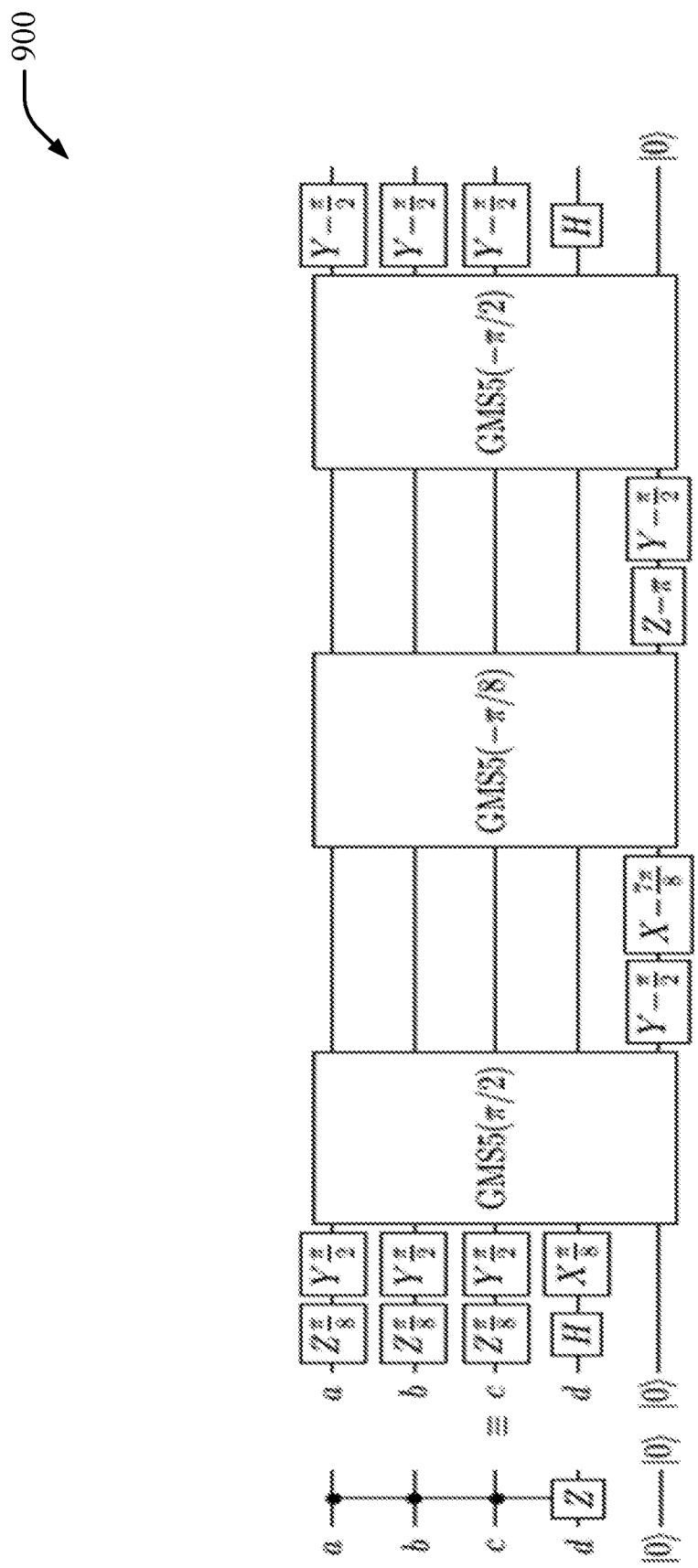

FIG. 9 is a diagram that illustrates an example of an optimized implementation of the CCCZ gate using three GMS gates in accordance with aspects of this disclosure.

Figure 10:
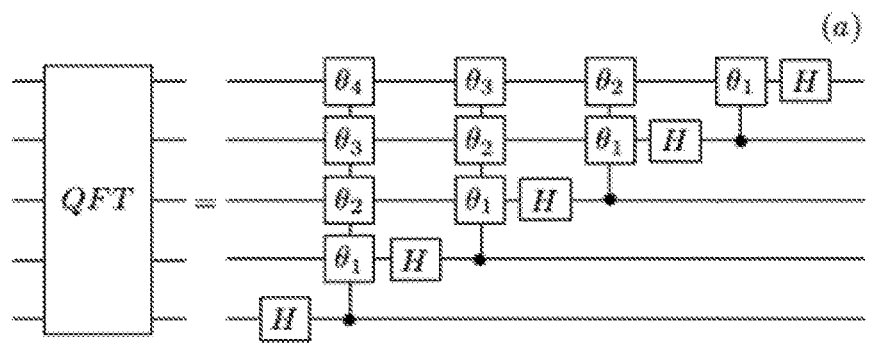
Figure 10:
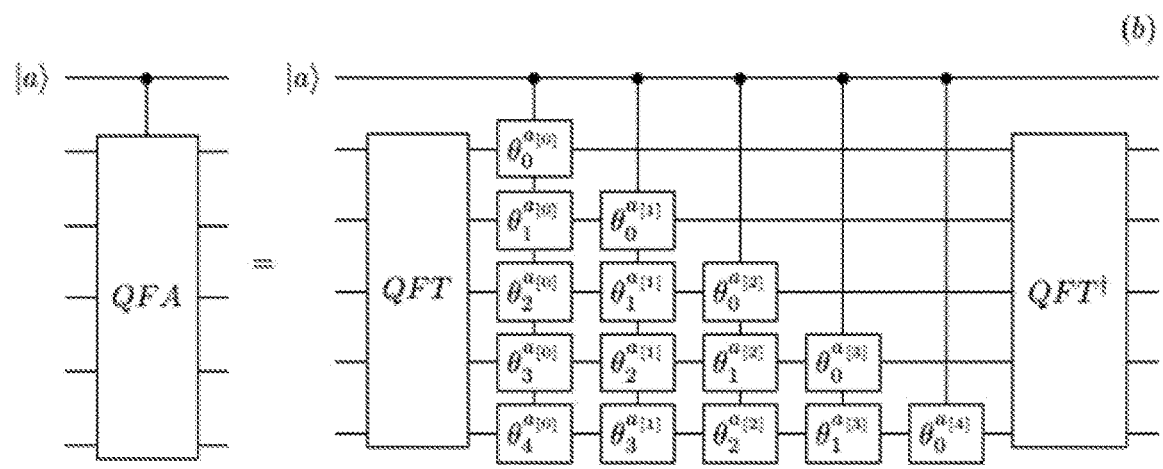
Figure 10:
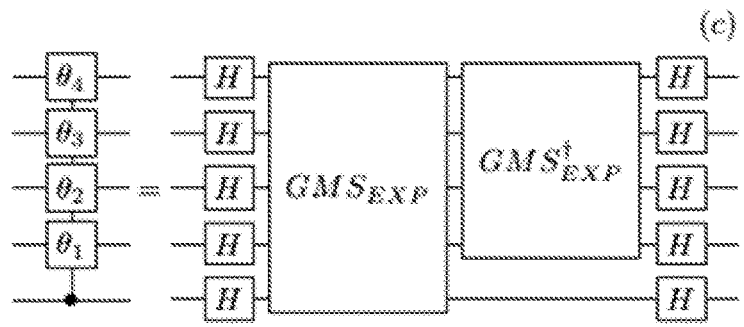

FIG. 10 is a diagram that illustrates examples of (a) a QFT circuit, (b) a QFA circuit, and (c) a subcircuit of the shape that repeatedly appears in (a) and (b) in accordance with aspects of this disclosure.

Figure 11A:
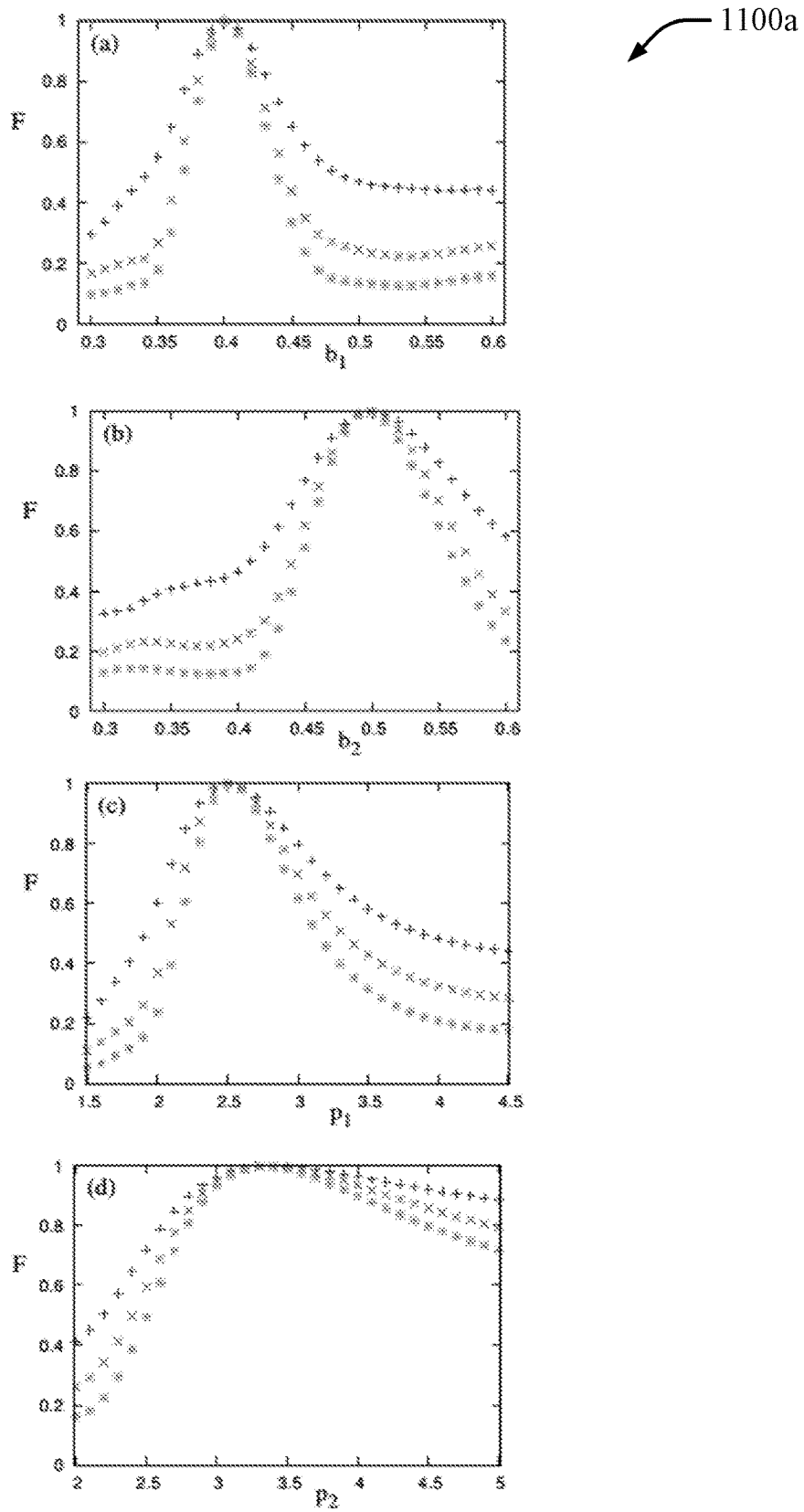

FIG. 11A is a diagram that illustrates examples of the fidelity of power law QFT for different parameters in accordance with aspects of this disclosure.

Figure 11B:
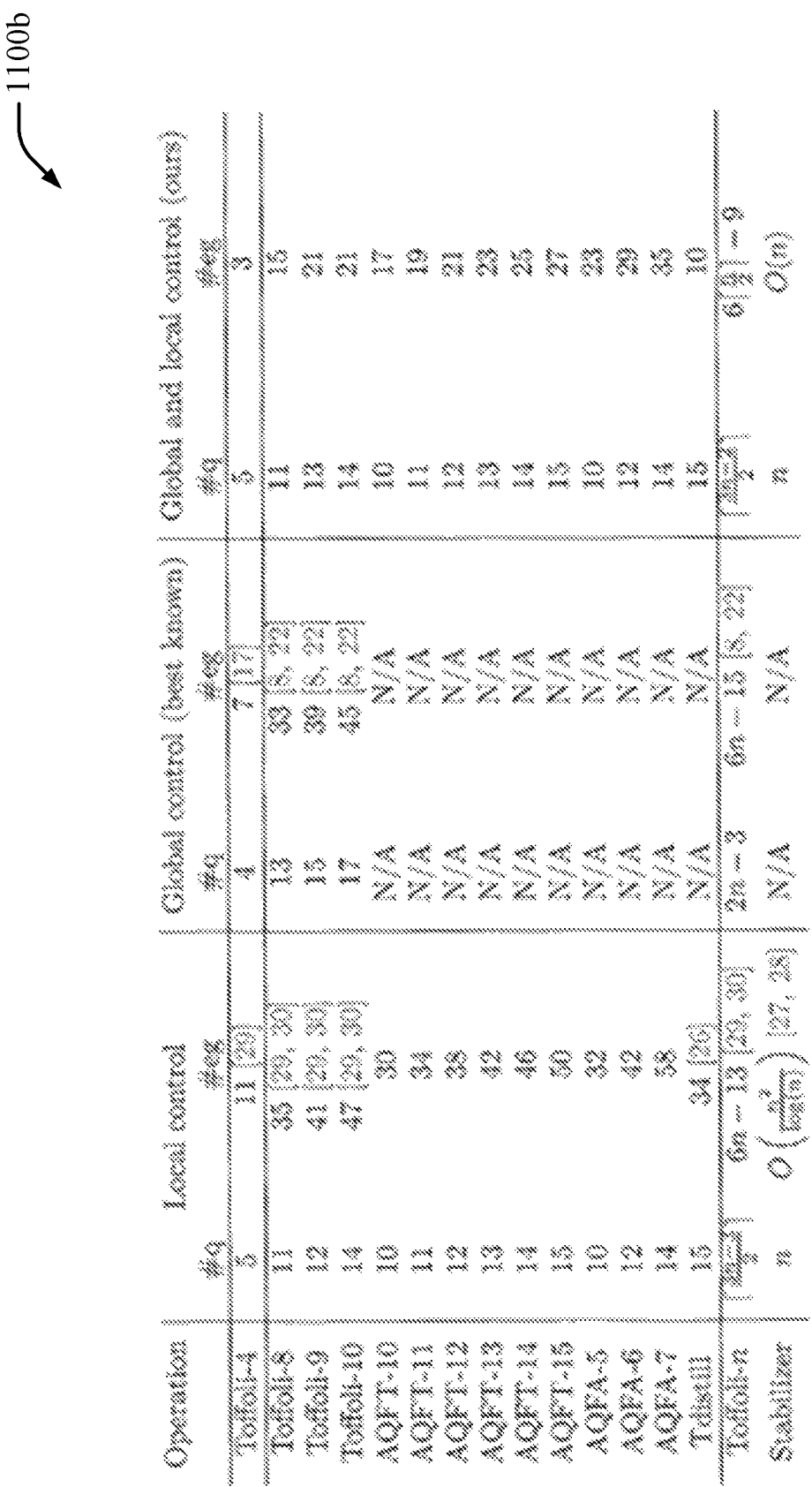

FIG. 11B is a table that illustrates advantages of the use of GMS gates in accordance with aspects of this disclosure.

Figure 12:
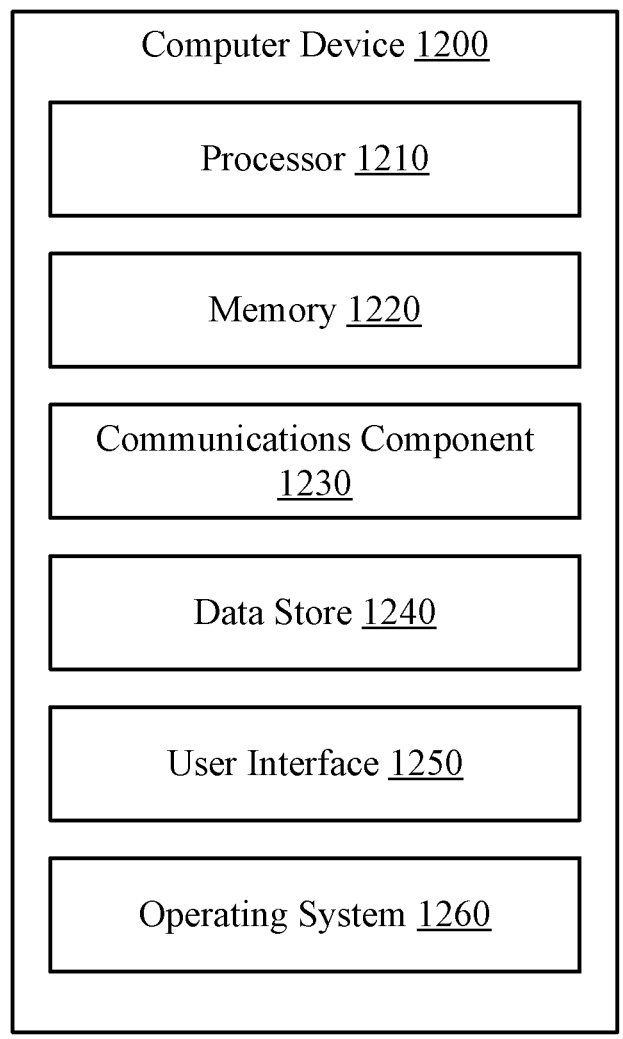

FIG. 12 is a diagram that illustrates an example of a computer device in accordance with aspects of this disclosure.

Figure 13:
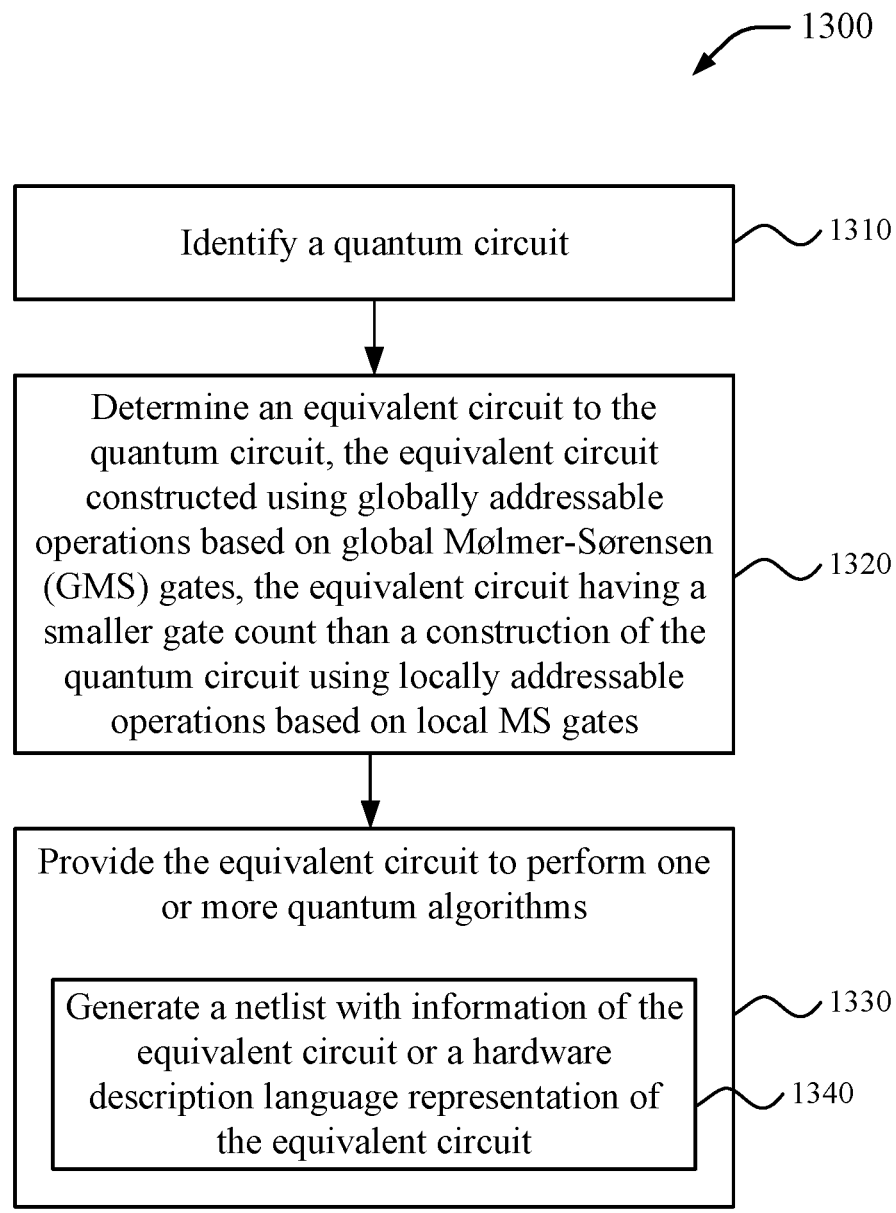

FIG. 13 is a flow diagram that illustrates an example of a method in accordance with aspects of this disclosure.

Figure 14:
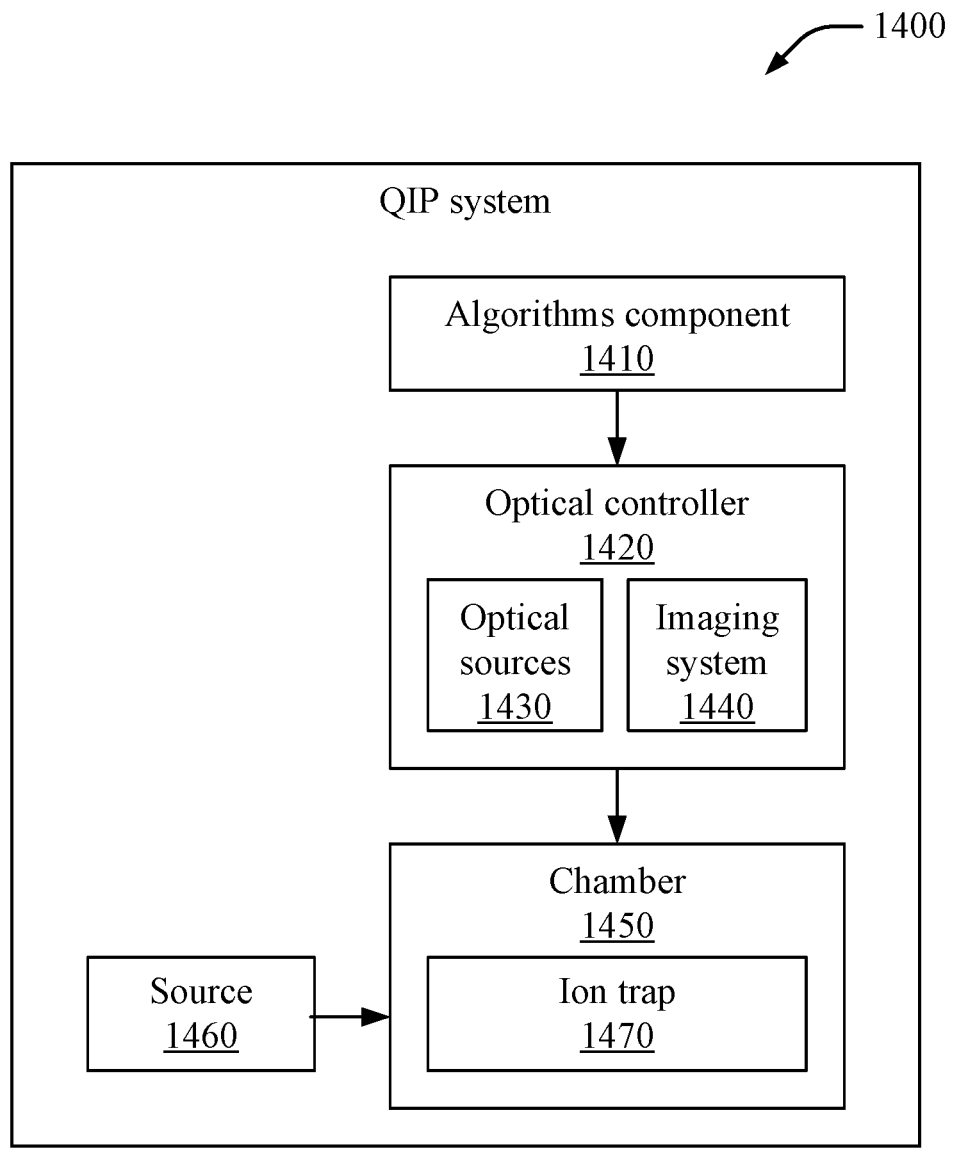

FIG. 14 is a block diagram that illustrates an example of a QIP system in accordance with aspects of this disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, trapped atomic ions and superconducting circuits are two examples of QIP approaches that have delivered small yet already universal and fully programmable machines. In trapped ion QIP, global interactions are more naturally realized as an extension of common two-qubit gate interactions. Therefore, it is desirable to use global entangling gates for efficient (e.g., reduced gate count) quantum circuit constructions to implement a global interaction in trapped ion technology.

One particular interaction available in the use of trapped ions for quantum computing is the so-called Mølmer-Sørensen (MS) gate, also known as the XX coupling or Ising gate. To achieve computational universality, the Mølmer-Sørensen gate (either locally addressable or globally addressable) is complemented by arbitrary single-qubit operations. These may come in different flavors, including the addressable $R(\theta; \emptyset)$ rotations of which at most two are needed to implement arbitrary single-qubit gate, or the addressable RZ rotation, which together with global RX and RY rotations also gives the single-qubit universality. Depending on the specifics, the control apparatus may allow the application of an XX gate to a selectable pair of qubits, globally, or globally to a subset of qubits. There are existing control apparatus that allow the application of the global Mølmer-Sørensen (GMS) gates, however, to date, such known approaches have not been studied in detail. In each case above, using an XX gate may come at a higher cost (expressed in terms of the duration and/or average fidelity) compared to the single-qubit gates.

This disclosure describes techniques for minimizing or reducing the number of times an XX gate is called (e.g., instantiated or used)—be it addressable local or global, thereby targeting the most expensive resource in quantum computations using trapped ions QIP. Specifically, the disclosure describes techniques for finding the instances of quantum computations that admit a more efficient implementation using global entangling gates compared to what may be accomplished using local entangling gates. Given that the control by global entangling operators applies a certain operation to multiple data, it can be thought of as a quantum analog of classical single instruction, multiple data (SIMD) architecture. The results of using the approaches described herein demonstrate practical advantages of quantum SIMD architecture beyond those examples already known.

Earlier work in this area has shown how to implement the parity function (also referred to as fan-in gate) using a constant number of two global entangling pulses. The concept of fan-in gates is discussed in more detail below with respect to consecutive CNOTs since it may be relevant to more advanced circuit constructions achievable based on the teachings of the present disclosure. Prior work has shown a two-GMS gate construction of the number of excitation operator used in quantum chemistry simulations. Moreover, ways or methods have been studied to implement quantum algorithms efficiently on a trapped ion quantum computer with the two-qubit gates enabled by the global entangling operator, concentrating on the case featuring anywhere between two to four qubits. Other work in this area has focused on quantum circuit compiling in the scenario where local addressable two-qubit gates are available. A two-GMS gate parity measurement implementation has been described previously, where it has been shown how to reduce the number of global pulses needed to just one (this construction can be inferred from FIG. 2 described in more detail below), and how to measure the eigenvalue of a product of Pauli matrices using only a constant number of global entangling pulses. In contrast, this disclosure describes how to determine a set of important quantum circuits, focusing on the computations of arbitrary size, that can be accomplished using fewer entangling pulses in cases where global entangling control is available. The new circuits developed and described in this disclosure include certain kinds of stabilizer circuits, number excitation operator, Toffoli-4 gate, Toffoli-n gate, Quantum Fourier Transformation (QFT) circuits, and Quantum Fourier Adder (QFA) circuits, thereby substantively extending the set of known efficient circuitry based on the global entangling pulse. The results can be directly accessible for implementation over trapped ions approaches featuring global control, and make a case for mixed local/global entangling control.

Computational universality of the control given by selectable two-qubit couplings and arbitrary single-qubit gate was the subject of an early foundational study establishing the upper bound of $O(n^3 4^n)$ and the lower bound of $\Omega(4^n)$ on the number of CNOT gates required to implement an arbitrary unitary. The upper bound was later improved to $O(4^n)$, at which point it asymptotically met the lower bound, settling the question of asymptotically optimal control by the entangling CNOT gates. For logical-level fault tolerant circuits one more step may be needed—specifically, that of decomposing all gates into a discrete fault-tolerant library, such as the one given by the Clifford and T gates. With the CNOT being a Clifford gate, the remaining step on top of asymptotically optimal constructions is to decompose arbitrary single-qubit unitaries into Clifford+T circuits. Euler angle decomposition may be used to express arbitrary single-qubit unitaries as a circuit with no more than three axial rotations, and z-rotations can be synthesized optimally as single-qubit Clifford+T circuits. Given additional resources, such as in-circuit measurement and classical feedback, even better solutions may be possible.

The upper bound $O(4^n)$ on the number of CNOT gates gives rise to the upper bound $O(4^n)$ on the number of GMS gates, since it can be easily established that a CNOT gate can be obtained using no more than constantly many GMS gates. A 4-GMS implementation of the CNOT gate can be obtained by applying the two-GMS construction illustrated in FIG. 1 to n-qubits with $\chi=\pi/2$, and then again to n−1 qubits with $\chi=-\pi/2$, selecting one specific qubit-to-qubit interaction that remains active. With the use of the maximal size GMS gates, this may be a slightly larger construction, relaying on FIG. 8C to express smaller GMS gates in terms of the maximal size GMS gate, but one with constantly many GMS gates nonetheless.

Figure 1:
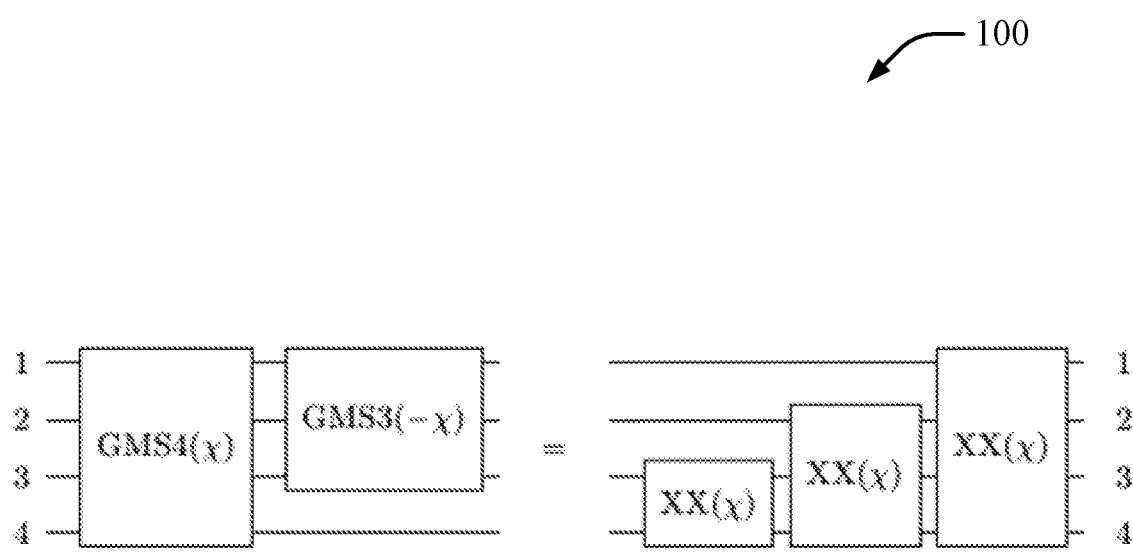
FIG. 1 is a diagram that illustrates an example of the usefulness of global gates in accordance with aspects of this disclosure.

FIG. 1 shows a diagram 100 with an example of the usefulness of global gates. GMS4 denotes a GMS gate defined according to equation (2) below, applied to all four qubits in the figure. GMS3 denotes a three-qubit GMS gate, applied to qubits number 1, 2, and 3. The common argument $\chi$ of the GMS gates specifies that all $\chi_{ij}$'s are equal to $\chi$. The $XX_{ij}(\chi)$ gate denotes a local XX gate, applied to qubits i and j with the angle $\chi$, according to equation (1) below.

In most practical cases, it may be desirable to implement a specific well-constructed computation, and those frequently come with known implementations relying on fewer than $O(4^n)$ entangling gates.

Control by local addressable operations is clearly easier to work with as far as implementing quantum computations is concerned, since most quantum algorithms are expressed in terms of local operations. In addition, the number of arbitrarily selectable two-qubit operations, (n−1) n/2, for an n-qubit computation (recall that the XX coupling does not distinguish between gate's control and its target), is higher than 1, being the number of individual full-size global gates. Moreover, an arbitrary circuit over two-qubit local control experiences only a constant factor blow up if it needs to be implemented as a circuit over global control (this is no more true if global control needs be expressed in terms of local control). These observations suggest that the local control is overall more nimble when it comes to implementing arbitrary quantum algorithms. However, it is not always the case that the implementations using local addressable gates are more efficient compared to those over global entangling operators. For example, it is known how to implement the 3-qubit Toffoli gate with only three size-3 global Mølmer-Sørensen gates, whereas the best known implementation over two-qubit local addressable control requires five entangling gates. Based at least partially on this example, this disclosure looks into what other important unitary transformations may exist that benefit from the global gates in their implementation via quantum circuits.

Global MS Gate

A local MS gate (XX), acting on $i^{th}$ and $j^{th}$ qubits, is defined as described below in equation (1)

$$XX_{ij}(\chi_{ij}) = e^{-i(\hat{\sigma}_x^{(i)}+\hat{\sigma}_x^{(j)})^2 \chi_{ij}/4} = e^{-i\hat{\sigma}_x^{(i)}\hat{\sigma}_x^{(j)}\chi_{ij}/2} \quad (1)$$

$$= \begin{pmatrix} \cos(\chi_{ij}/2) & 0 & 0 & -i\sin(\chi_{ij}/2) \\ 0 & \cos(\chi_{ij}/2) & -i\sin(\chi_{ij}/2) & 0 \\ 0 & -i\sin(\chi_{ij}/2) & \cos(\chi_{ij}/2) & 0 \\ -i\sin(\chi_{ij}/2) & 0 & 0 & \cos(\chi_{ij}/2) \end{pmatrix},$$

where $\hat{\sigma}_x^{(i)}$ denotes the Pauli-x operator acting on $i^{th}$ qubit. In comparison, a global MS (GMS) gate for an n-qubit system is defined according to equation (2) below $$\begin{aligned} GMS(\chi_{12}, \chi_{13}, \cdots, \chi_{1n}, \chi_{23}, \cdots, \chi_{n-1n}) &= \exp\left(-i\sum_{i=1}^{n}\sum_{j=i+1}^{n}(\hat{\sigma}_x^{(i)}+\hat{\sigma}_x^{(j)})^2\chi_{ij}/4\right) \\ &= \exp\left(-i\sum_{i=1}^{n}\sum_{j=i+1}^{n}\hat{\sigma}_x^{(i)}\hat{\sigma}_x^{(j)}\chi_{ij}/2\right), \end{aligned} \quad (2)$$

which is equivalent to the application of local XX gates to all n (n−1)/2 pairs of qubits for an n-qubit system. Since any two local XX gates always commute, the GMS gate is uniquely defined. For simplicity, a first focus may be on the GMS gate where $$\chi_{12}=\chi_{13}=\cdots=\chi_{1n}=\chi_{23}=\cdots=\chi_{n-1n},$$

and next consider other variants.

Intuitively, the availability of the GMS gate allows for an efficient implementation of a single-qubit-to-many-qubits coupling gate. Consider, for instance, a 4-qubit system as shown in FIG. 1. Applying the GMS gate on all four qubits and then applying the GMS gate to the top three qubits with the negative sign of the rotation parameter (e.g., −χ), results in a selective set of the XX gates acting between qubit number 4 and the rest, as shown in FIG. 1 on the right hand side. This means that, together with the ability of leaving out a qubit of choice, only two (global) entangling operators are needed to perform the desired transformation. Note that because qubit number 4 participates in all three XX gates as shown in FIG. 1 on the right hand side, even with the possibility of parallel operations acting on disjoint pairs of qubits at least three time steps may be required if restricted to the local XX couplings.

The rest of the disclosure relies on the standard single-qubit gates, including Hadamard (H in formulas and circuit diagrams), axial rotations RX, RY, and RZ (X, Y, and Z in circuit diagrams), as well as the two-qubit CNOT gate.

Efficient Circuits Using the GMS Gate

What follows below is a suite of quantum transformations, where GMS gates may be handily used to increase circuit efficiency. Specific implementation details are provided by explicitly constructing corresponding quantum circuits, and comparing them to those obtained using only local entangling gates to highlight the efficiency gain that results from the approaches described herein.

Consecutive CNOTs: Single-Control Many-Target CNOT (Fan-Out), and Many-Control Single-Target CNOT (Fan-In)

Figure 2:
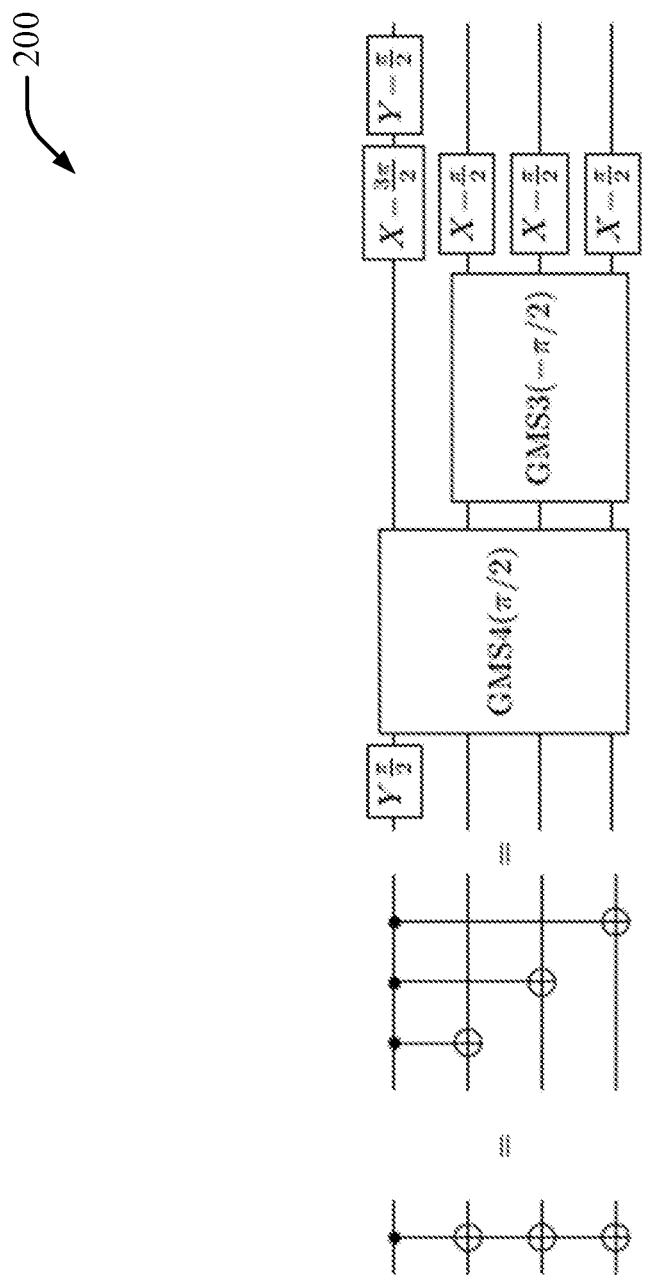
FIG. 2 is a diagram that illustrates an example of a four-qubit case of multiple CNOT gates sharing a single control qubit and targeting the rest of the qubits in accordance with aspects of this disclosure.

Consider a set of CNOT gates with a shared control qubit, also known as the fan-out gate. As illustrated in FIG. 2 for the sample case of n=4, we can use a pair of GMS gates, together with single-qubit rotations $RX(\theta)=e^{-i\hat{o}_x\theta/2}$ and $RY(\theta)=e^{-i\hat{o}_y\theta/2}$, to implement the entire set of such n−1 CNOT gates. In particular, a total of two GMS gates may be required, one over n qubits with uniform angles π/2 and the other over n−1 qubits with the angle −π/2, singling out the control qubit.

In FIG. 2, a diagram 200 shows a four-qubit case of multiple CNOT gates sharing a single control qubit and targeting the rest of the qubits. Only two GMS gates may be required to implement a total of n−1 local XX gates, corresponding to n−1 CNOT gates.

An n-qubit fan-in gate (a set of CNOTs sharing a target) can be implemented as a layer of n Hadamard gates, followed by the fan-out gate, followed by the second layer of n Hadamard gates. This means that an arbitrary size fan-in gate can also be implemented using a constant number of two GMS gates. It is to be noted that aspects of these implementations were previously known (fan-in was explicitly studied, and fan-out can be easily obtained from the fan-in). It is also to be noted that to measure the outcome of the parity function on the top qubit (see FIG. 2), the second GMS gate in the construction outlined in FIG. 2 need not be applied, as it does not a affect the qubit being measured.

An immediate application of this efficient implementation (n−1 local XX gates replaced by a pair of GMS gates) may be observed or applied, for instance, in stabilizer circuit constructions.

Figure 3:
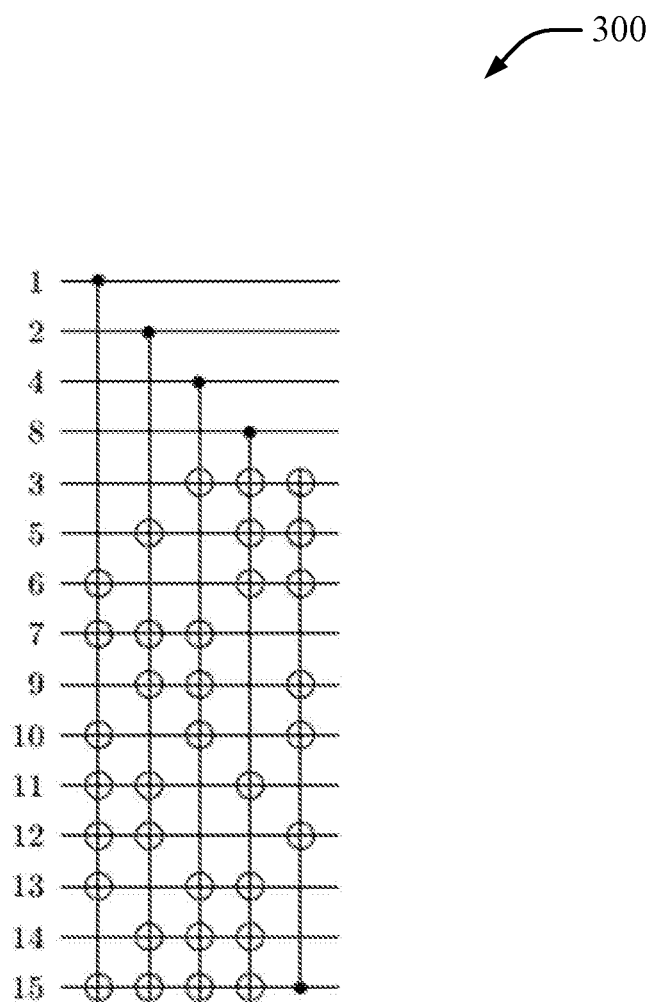
FIG. 3 is a diagram that illustrates an example of an encoding circuit Tdistill of the [[15, 1, 3]] code used to distill the $|A\rangle$ state in accordance with aspects of this disclosure.

FIG. 3 shows a diagram 300 that describes an encoding circuit Tdistill of the [[15, 1, 3]] Reed-Muller code, used to distil the |A⟩ state. It requires a total of 34 CNOT gates. The circuit can be implemented using only 10 GMS gates. Since the [[15, 1, 3]] encoding circuit is used to distil the |A⟩ state, its efficient GMS-enabled implementation may potentially be used to synthesize the logical-level T gate efficiently, constituting an important optimization for fault-tolerant quantum computing. In some scenarios, however, GMS gates may be difficult to use fault-tolerantly.

GMS gates can furthermore be used to obtain an implementation of arbitrary n-qubit stabilizer unitary using at most 12n−18 entangling pulses. To establish this, a 9-stage layered decomposition -C-P-C-P-H-P-C-P-C- is considered. It is to be noted that two of the -C- stages (each corresponds to CNOT-based circuits) are given by the upper triangular Boolean matrices. This means that each can naturally be implemented as a set of n−1 fan-out gates. Of these, the smallest fan-out is the CNOT, and thus it can be implemented using a single GMS. This means that the total number of GMS gates required to implement an upper/lower triangular linear reversible transformation is 2n−3. The other two -C- stages are arbitrary linear transformations. Using LU decomposition (e.g., decomposition of a matrix into a product of a lower triangular matrix and an upper triangular matrix), each can be implemented as a circuit over 2(2n−3)=4n−6 GMS gates. The total GMS count required to implement an arbitrary stabilizer unitary is thus 2(2n−3)+2 (4n−6)=12n−18.

The number of GMS gates required to implement an arbitrary stabilizer unitary, 12n−18, is significantly less than $\Omega(n^2/\log n)$ of the two-qubit CNOT gates required to accomplish the same. The comparison described above, however, may not be entirely accurate. This is because the number of different functions computed by the CNOT gates spanning n qubits is (n−1)n, whereas the number of the GMS gates with the fixed rotation angle of π/2 and arbitrary set of inputs is $2^n$, which is greater on the order than (n−1)n. A more accurate or perhaps more desirable approach is to compare the GMS count of 12n−18 to the CNOT depth of 14n−4 over Linear Nearest Neighbor (LNN) architecture. This is because the number of functions computed by depth-1 CNOT circuits over LNN is given by the expression $$\frac{2^{n+1}+(-1)^n}{3},$$

and this number is similar to $2^n$. The comparison reveals that the GMS-based construction proposed in this disclosure still provides an advantage in terms of efficiency.

Toffoli-n

Below are considered the multiply-controlled NOT gates, also known as the multiple-control Toffoli gates, and more specifically the 3-qubit (Toffoli-3) and the 4-qubit (Toffoli-4) cases.

Figure 4A:
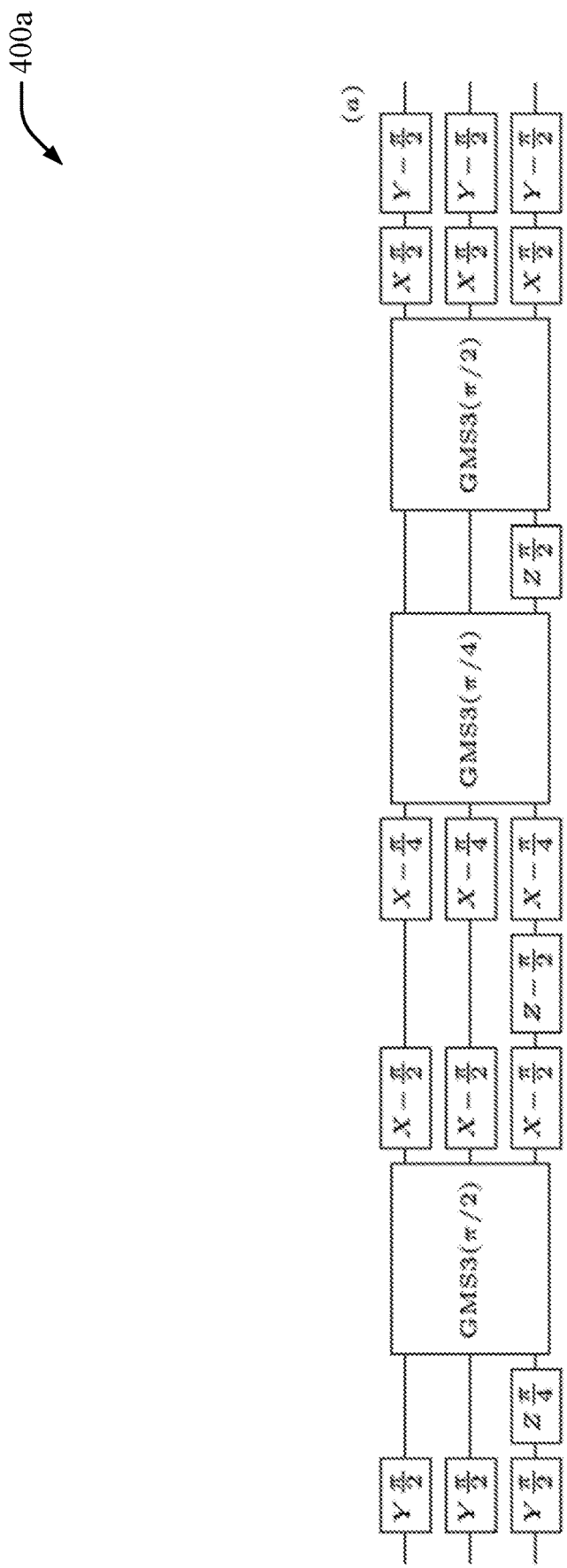
FIGS. 4A and 4B are diagrams that illustrate an example of (a) a Toffoli-3 and (b) a Toffoli-4 without ancillary qubits in accordance with aspects of this disclosure.
Figure 4B:
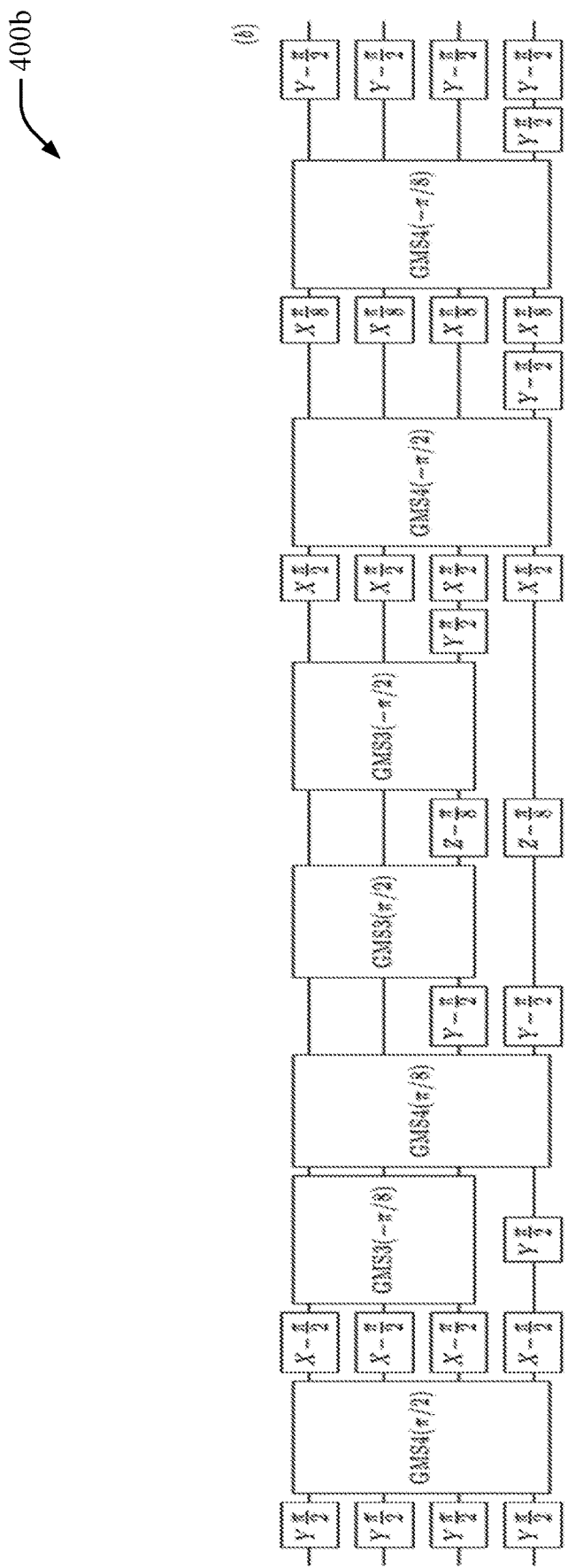

The efficient use of GMS gates in the case of the multiply-controlled NOT (Toffoli) has previously been shown or described for the Toffoli-3 and Toffoli-4 gates. In particular, a GMS-based circuit decomposition for the triply-controlled Z gate has been presented, equivalent to the Toffoli-4 through conjugating the target by a pair of Hadamard gates. For convenience, the respective constructions are shown in FIGS. 4A and 4B. FIG. 4A shows a diagram 400a that includes GMS-based implementation of Toffoli-3 and FIG. 4B shows a diagram 400b that includes GMS-based implementation of Toffoli-4. It is to be noted that in the case of the Toffoli-3 only 3 GMS gates may be needed, compared to 5 local two-qubit gates, and for the Toffoli-4, only 7 GMS gates may be needed, compared to 11 local two-qubit gates. Unlike some implementations, the 7-GMS Toffoli-4 construction need not require an ancillary qubit.

In pursuit of further gate count reduction, one thing to consider is to employ ancillary qubits in the GMS-based construction of the n-qubit Toffoli gate. The employment of ancillary qubits to reduce the gate counts in constructing the Toffoli-n gate has been considered in the context of relying on local entangling gates. Using ancillae turns out to be helpful in the case of quantum circuits employing the GMS gate as well. Below is described a step-by-step construction of the GMS-based ancilla-aided Toffoli-4 gate, although it is not clear that there are any improvements if applied to the Toffoli-3 circuit.

Figure 4C:
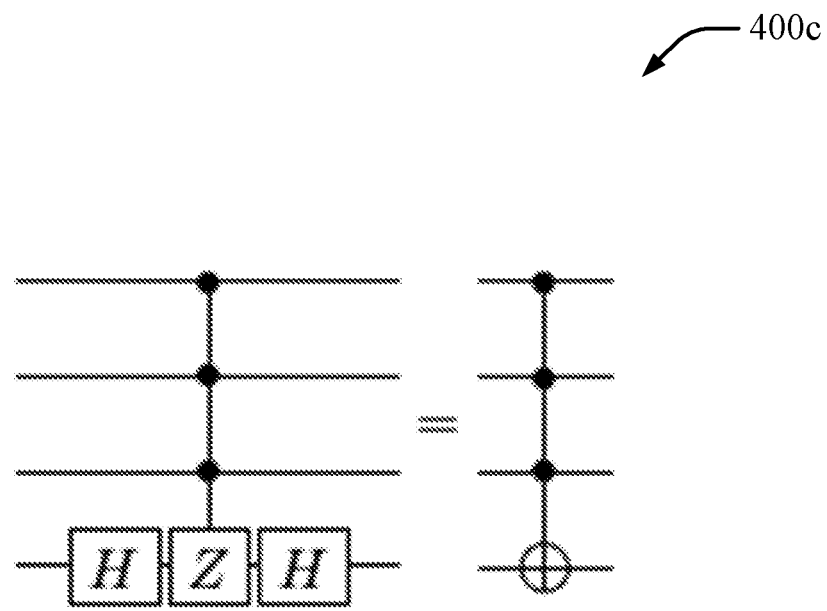
FIG. 4C is a diagram that illustrates an example of the Toffoli-4 gate being equivalent to a CCCZ gate up to the conjugation by the Hadamard gates in accordance with aspects of this disclosure.

It is to be noted that the Toffoli-4 gate is equivalent to the CCCZ gate up to the conjugation by the Hadamard gates, as illustrated in a diagram 400c in FIG. 4C. In this case, the CCCZ(a, b, c, d)gate performs the transformation $$|abcd\rangle \mapsto (-1)^{abcd}|abcd\rangle = (e^{i\pi/8})^{8abcd}|abcd\rangle = \omega_{16}^{8abcd}|abcd\rangle,$$

where $\omega_{16}$ is the primitive $16^{th}$ complex root of the number 1. Using mixed arithmetic equality $2xy=x+y-(x\oplus y)$ three times allows to rewrite the above formula as $$|abcd\rangle \mapsto \Omega_{16}^{a+b+c+d-(a\oplus b)-(a\oplus c)-(a\oplus d)-(b\oplus c)-(b\oplus d)-(c\oplus d)+(a\oplus b\oplus c)+(a\oplus b\oplus d)+(b\oplus c\oplus d)-(a\oplus b\oplus c\oplus d)}|abcd\rangle.$$

This function can thus be implemented as a CNOT and $$RZ\left(\pm\frac{\pi}{8}\right)$$

circuit by applying Z rotation with the positive sign to the linear terms $\{a, b, c, d, a\oplus b\oplus c, a\oplus b\oplus d, a\oplus c\oplus d, b\oplus c\oplus d\}$ and Z rotation with the negative sign to the terms $\{a\oplus b, a\oplus c, a\oplus d, b\oplus c, b\oplus d, c\oplus d, a\oplus b\oplus c\oplus d\}$, with each such linear term obtainable by the CNOT gates. Below is described how to induce all necessary CNOT gates to allow the application of the necessary RZ gates, using only a few GMS gates.

Figure 4D:
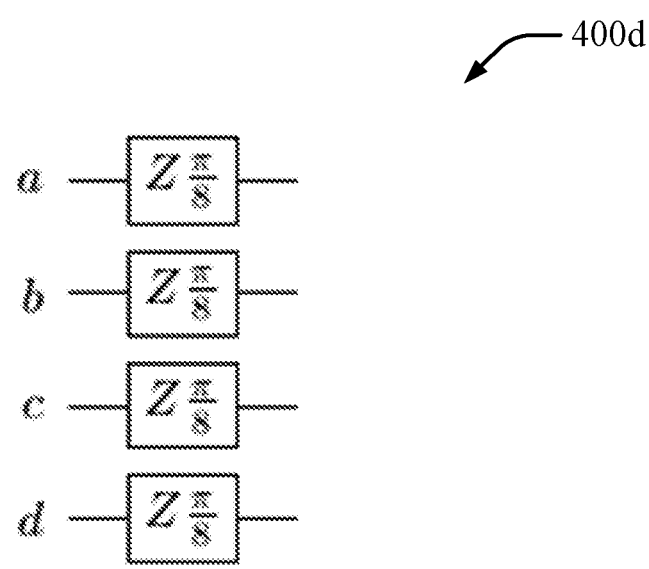
FIG. 4D is a diagram that illustrates an example of circuit construction applying $$RZ\left(\pm \frac{\pi}{8}\right)$$

First it is noted that the linear functions with the single literate each, $\{a, b, c, d\}$, are the original qubits provided on the input side of the circuit. Therefore, all length-1 linear terms may be implemented by simply applying $$RZ\left(\pm\frac{\pi}{8}\right)$$

single-qubit rotation gates to each respective qubit. By doing so, the circuit shown in a diagram 400d in FIG. 4D can be constructed using no GMS gate and implementing the transformation $|abcd\rangle \mapsto \omega_{16}^{a+b+c+d}|abcd\rangle$. Next point is finding how to apply as few as possible GMS gates in a way that enables to exercise the remaining 11 Z rotations.

To apply the Z rotation to the length-4 linear term, $a\oplus b\oplus c\oplus d$, an ancillary qubit in the $|0\rangle$ state is introduced, all qubits are copied into it using a set of four CNOTs sharing the target, and then those CNOTs are uncomputed. This allows the application of one new Z rotation between the two layers of the CNOT gates, and the number of the GMS gates required to implement this construction is two, as illustrated in FIG. 5A.

FIG. 5A shows a diagram 500a illustrating how to obtain the phase $\Omega_{16}^{-(a\oplus b\oplus c\oplus d)}$. The circuit shown in FIG. 5A can be used in various applications such as quantum chemistry as well as for other optimization problems. One way to see how the circuit in FIG. 5A comes about may be explained by looking back at FIG. 2. First, the circuit in FIG. 5A has consecutive CNOT gates with different controls and the same target. This is similar to the circuit in FIG. 2, except that in this case there are consecutive CNOT gates with different targets and the same control. The reversal of the control/target of a given CNOT gate may be achieved by conjugating the CNOT gate by H (Hadamard) gates, where the H gate may be decomposed into a series of well-known native single qubit gates. Applying the conjugation by H gates to FIG. 2 and then replacing the CNOT "staircases" in FIG. 5A results in the circuit shown in the bottom of FIG. 5A, which leverages the use of GMS gates. Note that the resulting circuit after such type of straight replacement may be suboptimal. By carefully selecting replacement sequences (e.g., inverse of a CNOT is a CNOT and thus the result shown in FIG. 2 with the GMS gates when inversed is still a valid result) and commutation relations it is possible to reduce the gate count.

The circuit constructed in the diagram 500a in FIG. 5A thus far performs the transformation $|abcd\rangle \mapsto \Omega_{16}^{a+b+c+d-(a\oplus b\oplus c\oplus d)}|abcd\rangle$. Note that each of the two sets of the CNOT gates on the left hand side of the circuit equality in FIG. 5A requires two GMS gates to be implemented (both are fan-in gates, considered earlier), for a total of four GMS gates, two GMS5 and two GMS4. However, the two GMS4 can be chosen with the opposite signs and they commute with all other gates that are introduced in the middle to cancel out. This means that only two GMS5 gates are needed in the construction proposed in FIG. 5A.

Next is to apply the remaining 10 Z rotations to obtain the desired CCCZ gate. To do so, consideration may be given to the circuit identity shown in a diagram 500b in FIG. 5B, where the left hand side, trivially, performs a phase rotation by the angle $\theta$ applied to the linear function $x\oplus y$ and the right hand side reports an equivalent circuit based on the XX gate, up to a global phase. This construction can be generalized to n qubits, by replacing the XX gate with the GMS on the right hand side, while conjugating by the layer of Hamadards before and after. What this accomplishes is the application of phases to EXORs of all pairs of participating variables, as described by the circuit on the left hand side. This is described more formally as follows $$H[x_1]H[x_2]\ldots H[x_n]GMSn[x_1, x_2, \ldots, x_n](\theta)H[x_1]H[x_2]\ldots H[x_n]: |x_1 x_2 \ldots x_n\rangle \mapsto e^{i\theta\Sigma_{j<k}x_j\oplus x_k}|x_1 x_2 \ldots x_n\rangle.$$

Next is to apply the above identity over GMS to the ongoing construction of the Toffoli-4 gate. To obtain length-3 linear functions, Hadamard-conjugated GMS5($\pi/8$) is inserted in the middle of the current circuit (FIG. 5A). The effect this has is the introduction of phase $\pi/8$ applied to all pairs of qubits participating in the construction. In the middle of the circuit the qubits are described by the linear functions $\{a, b, c, d, a\oplus b\oplus c\oplus d\}$. Thus, the set of EXOR pairs is $$\{a\oplus b, a\oplus c, a\oplus d, b\oplus c, b\oplus d, c\oplus d, a\oplus b\oplus c, a\oplus b\oplus d, a\oplus c\oplus d, b\oplus c\oplus d\}.$$

This means that the overall action performed by the circuit with 3 GMS gates can be written as $$|abcd\rangle \mapsto \Omega_{16}^{a+b+c+d-(a\oplus b\oplus c\oplus d)+(a\oplus b)+(a\oplus c)+(a\oplus d)+(b\oplus c)+(b\oplus d)+(c\oplus d)+(a\oplus b\oplus c)+(a\oplus b\oplus d)+(a\oplus c\oplus d)+(b\oplus c\oplus d)}|abcd\rangle.$$

It is to be noted that the signs of the length-2 terms are not the ones that are wanted. This may, however, be corrected by applying Hadamard-conjugated GMS4($-\pi/4$) to the qubits $\{a, b, c, d\}$, resulting in the phase correction by the product $$\Omega_{16}^{-2(a\oplus b)-2(a\oplus c)-2(a\oplus d)-2(b\oplus c)-2(b\oplus d)-2(c\oplus d)},$$

and leading to the desired transformation $$|abcd\rangle \mapsto \Omega_{16}^{a+b+c+d-(a\oplus b)-(a\oplus c)-(a\oplus d)-(b\oplus c)-(b\oplus d)-(c\oplus d)+(a\oplus b\oplus c)+(a\oplus b\oplus d)+(a\oplus c\oplus d)-(a\oplus b\oplus c\oplus d)}|abcd\rangle.$$

accomplished as a 4-GMS circuit shown in FIG. 6A, where FIG. 6A shows a diagram 600a describing a CCCZ gate using four GMS gates. The right hand side of FIG. 6A shows two Hadamard gates, removing which transforms CCCZ gate into Toffoli-4.

Using a similar approach, a 3-GMS circuit can be obtained by implementing the CCZ gate on qubits a, b, and c, as shown in a diagram 600b in FIG. 6B, which is different from other reported implementations.

An implementation of the n-qubit Toffoli gate is briefly outlined using 3n−9 GMS gates and (n−2)/2 ancillae for even n, and 3n−6 GMS gates and (n−1)/2 ancillae for odd n, where n≥6. This approach provides better results than 6n−12 local CNOT gates results previously achieved, while using a comparable number of ancillae. This construction relies on nesting efficient 3-GMS Toffoli-4 gates (shown in FIG. 9), such as illustrated in FIG. 7, to obtain larger multiple-control Toffoli gates. FIG. 7 shows a diagram 700 that illustrates ancilla-aided construction of the Toffoli-6 using a set of three Toffoli-4, each of which is constructible using three GMS gates. For odd n, one pair of 3-GMS Toffoli-3 gates needs to be used (equivalently, a set of two relative-phase Toffoli-3 gates, requiring 3 local entangling operations each), explaining the difference between gate counts for odd and even n.

GMS with Other Parameters

The description above has focused on using GMS gates with all equal rotation angles $\chi_{ij}$, and an arbitrarily selectable subset of qubits to which those global gates apply. Such gates may not always be possible to obtain directly in an experiment or implementation. There are possible experimental or operational setups that allow for the application of global Mølmer-Sørensen gates affecting all n qubits participating in the computation. As such, an (n−1)-qubit GMS gate may not be directly available on an n-qubit system. To circumvent this and enable smaller GMS gates, this disclosure proposes the following approach.

First, start with the circuit identity illustrated in a diagram 800a in FIG. 8A. Using the identity in FIG. 8A recursively, such as illustrated in a diagram 800b in FIG. 8B, it is possible to arrive at the conclusion that the RZ(π) gate effects a spin echo on the identical XX gates to its left and right, provided that the qubit that the RZ(π) applies to also participates in the XX gates, and as a result cancels out the respective XX interactions. Based on this property, FIG. 8C illustrates how to obtain an (n−1)-qubit GMS gate out of two n-qubit GMS gates. FIG. 8C shows a diagram 800c that illustrates GMS(n−1) using two GMSn for the case of n=5. The construction can be used iteratively to obtain global gates spanning arbitrarily selectable subsets of qubits, and enabling all constructions described in connection with efficient circuits using GMS gates in the case when only the maximal size GMS gate is available. This is at least partially the basis for the construction of a more efficient Toffoli-4 implementation. Specifically, Toffoli-4 gate may be obtained using only 3 maximal size GMS gates on a 5-qubit machine. This is because substituting GMS4(−π/4) (FIG. 8C) into GMS-enabled implementation of the Toffoli-4 gate (FIG. 6A) may result in the circuit over 5 GMS5 gates, however, GMS4(π/8) used in FIG. 6A meets the newly introduced GMS4(−π/8) and they cancel out, reducing the GMS gate count to 3.

This improved construction is illustrated in FIG. 9. FIG. 9 shows a diagram 900 that illustrates an optimized implementation of the CCCZ gate using three GMS gates. The right hand side of FIG. 9 shows two Hadamard gates, which when removed transforms CCCZ gate into Toffoli-4. This optimized 3-GMS Toffoli-4 construction relies on notably fewer entangling pulses compared to 11 two-qubit gates or 7 GMS gates.

The signs of $\chi_{ij}$ may furthermore be determined, instead of using their uniform assignment. It is, however, expected that future trapped ions experiments or implementations will feature a fully controllable sign of the interaction, and this will not be an issue. Should the signs be uncontrollable, this provides an additional challenge, since constructions in FIG. 1 and FIG. 2 rely on the ability to apply GMS gates with the inverted sign of the rotation angle. In case when the signs cannot be controlled individually, the inverse GMS gate can, in fact, be induced by the single-qubit corrections applied to the GMS gates with uncontrollable parameter signs as follows.

First, start with the following identity $$XX_{ij}^{X}(\chi) := XX_{ij}(-\chi) = -i \cdot RX_i(\pi) RX_j(\pi) XX_{ij}(\pi-\chi),$$

where $RX_k$ denotes the RX gate applied to the $k^{th}$ qubit. Using this identity n(n−1)/2 times allows to construct the GMS† using only one GMS gate, as follows:

$$GMS^\dagger(\chi) := \prod_{i=1}^{n} \prod_{j=i+1}^{n} XX_{ij}(-\chi) = (-i)^{n(n-1)/2} \prod_{i=1}^{n} \prod_{j=i+1}^{n} RX_i(\pi) RX_j(\pi) XX_{ij}(\pi-\chi) =$$

$$(-i)^{n(n-1)/2} \left(\prod_{i=1}^{n} RX_i(\pi)\right)^{n-1} \left(\prod_{i=1}^{n} \prod_{j=i+1}^{n} XX_{ij}(\pi-\chi)\right) =$$

$$(-i)^{n(n-1)/2} \left(\prod_{i=1}^{n} RX_i((n-1)\pi)\right) GMS(\pi-\chi).$$

In other words, whenever GMS† is not directly available due to the inability to invert the sign of the interactions, i.e., $\chi \in [0, \pi]$, the GMS† may be still constructed with the use of a single GMS gate by taking the parameter value of $(\pi-\chi) \in [0, \pi]$, and performing single-qubit corrections. This enables constructions from FIG. 1 and FIG. 2 in the scenario with uncontrollable signs of the individual interactions within GMS.

Quantum Fourier Arithmetic

The case where all $|\chi_{ij}|$ are constant is considered above, regardless of the choice of i and j. However, it is possible that $|\chi_{ij}|$ drops off as a function of the distance |i−j|. This may be natural given physical interaction strengths typically scale with the distance between qubits.

In case when the strength of the interaction falls off exponentially fast, as $\chi_{ij} \sim 2^{-|i-j|}$, it can be easily shown that the Quantum Fourier transform (QFT) may be constructed efficiently using such global pulses. Specifically, the efficient implementation uses just 2n global pulses, as opposed to n(n−1)/2 local two-qubit gates, for a QFT of size n. This also enables an implementation of the Quantum Fourier adder (QFA) with only a linear number of global gates, rather than a superlinear number of gates, making the Fourier-based arithmetic circuits more competitive than the Boolean counterparts.

FIG. 10 shows a diagram 1000 with (a) the QFT circuit and (b) the QFA circuit, and (c) how the GMS gates may be used to deliver the reduced gate count scaling in constructing the Fourier circuits. That is, in FIG. 10, (a) shows the GMS-based QFT circuit, where $\theta_d$ denotes a phase rotation gate with the rotation angle $\pi/2^d$, (b) shows the GMS-based QFA circuit, $\theta_d^{a[j]}$ denotes a phase rotation gate with the rotation angle $\pi/2^d$, and $\alpha_{[j]}$ denotes the control qubit that corresponds to the $j^{th}$ bit value of the integer a of the input state $|a\rangle$, and (c) shows a subcircuit of the shape that repeatedly appears in (a) and (b), and how it may be implemented using only two GMS gates. The subscript EXP of $GMS_{EXP}$ denotes the exponential drop off in the strength of the interaction, i.e., $\chi_{ij} \sim \pi/2^{-|i-j|}$.

The exponential drop off in the strength of the interaction, however, appears to be unrealistic. Instead, the decrease in the strength of the interaction as a power of the distance d as $d^p$, where $p \in [0,3]$ seems more realistic. This leads to the issue of how well the desired exponential drop off can be approximated with such physical-level global gates. Prior work in this area may provide some guidance. Specifically, the quality of such Fourier circuits (QFT, QFA) is well preserved even when we alter the fundamental form of the signal strength. For instance, when the exponential drop off, $\pi/2^d$, where d is the distance between qubits, is replaced with a power law hierarchy, such as $\pi/d^p$, the power p of the drop off power law may be chosen such as to obtain the best possible quality of approximation. In some instances it has been calculated numerically that the power $p_{opt}=1.4$ renders the maximum quality for a set of parameters. Fortunately, $p=1.4$ is within the limits $p \in [0,3]$.

Based at least in part on the description above, it is proposed an extended method of the power law approximation of the exponential drop off that is useful for quantum Fourier arithmetic circuits. Specifically, the disclosure describes techniques that use a few GMS gates to approximate a single stage of the exponentially dropping interaction strength (see (c) in FIG. 10). This is in contrast to a simple replacement of the single-stage exponential drop off with a single-stage power law drop off as has been previously proposed. In particular, a numerically approximation of the exponential drop off with a set of m power law drop offs is performed, as shown in equation (3), $$\frac{\pi}{2^j} \approx \sum_{i=1}^{m} \frac{\pi}{b_i j^{p_i}}. \tag{3}$$

Since the circuit realization of each power law requires two GMS gates, the approximation by m power laws amounts to a cost of 2m GMS gates.

One objective is to numerically determine a set of $b_i$ and $p_i$ parameters such that the term in equation (3) minimizes the approximation error, in order to best match the exact exponential drop off, as seen in the quantum Fourier arithmetic circuits. A straightforward generalization of related analytical works reveals that the fidelity of the QFT may be approximated by the term in equation (4) as shown below, $$F_{QFT} \approx \exp\left\{-\pi^2 \sum_{j=1}^{n} \frac{3(n-j)}{64} \left[\frac{1}{2^j} - \left(\sum_{i=1}^{m} \frac{1}{b_i j^{p_i}}\right)\right]^2\right\}, \tag{4}$$

meaning we obtain the best fidelity by minimizing the value of the sum in the exponent in (4). Minimizing the exponent in (4) analytically is a non-trivial task, and thus may need to resort to a numerical approximation. In particular, the search is restricted to $|b_i| \leq 0.6$ and $1.5 \leq p_i \leq 4$, closely following what may be achievable in practice. For m=2 the selection of the values $b_1=0.4$, $b_2=-0.5$, $p_1=2.5$, and $p_2=3.4$ results in the minimal exponent in equation (4), that is consistent with the peaks in fidelity observed in FIG. 7 for the sample cases of n=10, 12, and 14 qubits. The peak fidelity $F_{peak} \approx 1$ demonstrates a high quality of the double-power approximation of the exponential drop off, making the efficient GMS-based construction an attractive alternative in experiments.

FIG. 11A shows a diagram 1100a that illustrates the fidelity of the power law QFT with m=2 near its analytically predicted optimum, $b_1=0.4$, $b_2=-0.5$, $p_1=2.5$, $p_2=3.4$. In the order of (a)-(d), we fix all four parameters except for (a) $b_1$, (b) $b_2$, (c) $p_1$, and (d) $p_2$. In the figure, n=10 (pluses), n=12 (crosses), and n=14 (asterisks).

A similar numerical investigation is conducted for QFA. This time, since j=0, π-rotation (see equation (3)) in the QFA as shown in FIG. 10 needs to be implemented, it is possible to modify the power-law expansion according to equation (5) below $$\frac{\pi}{2^j} \approx \sum_{i=1}^{m} \frac{\pi}{b_i (j+1)^{p_i}}. \tag{5}$$

Once again, the best choices (b, p) pairs are numerically found, as in the previous case of the QFT with m=2, that result in the best performance.

Summary of the Results

FIG. 11B shows a diagram 1100b with a TABLE 1 that describes advantages of the use of GMS gates. The numbers for the global control enabled implementations of the Toffoli-8 . . . 10 were obtained by combining the 3-GMS implementation of the Toffoli-3 with the nested construction. The two-qubit gate counts for AQF T-10 . . . 15 and AQFA-5 . . . 7 circuits were obtained using known standards constructions, so as to match the approximation quality of our GMS-enabled implementations while using the minimal number of local gates. A high number of N/A shown in the table suggest that not enough effort has been put into developing implementations that use global control yet, highlighting one of the main messages of this disclosure.

As noted above, TABLE 1 summarizes the advantages of using global entangling pulse enabled constructions developed in this work over best known circuitry relying on both local entangling control and, when available, global entangling control. Columns #q and #eg show the number of physical qubits and the number of entangling gates needed to implement the operation specified by the column "Operation", with various approaches to the entangling control specified by the names of the multicolumns. The benchmark functions used are Toffoli-n—the maximal size multiple control Toffoli gate over n qubits, AQFT-n—approximate QFT over n qubits, AQFA-n—approximate QFA over two n-bit numbers, and Tdistill—encoding circuit for the [[15, 1, 3]] code. A selection has been made between 2-GMS gate and 4-GMS gate approximations of the circuit layers (see (c) in FIG. 10) to best demonstrate the advantage over two-qubit local control, and obtained the two-qubit gate count for AQFT and AQFA circuits over local control such as to match the performance of GMS-enabled constructions. TABLE 1 breaks down the set of operations that benefit from GMS gates intro three subsets—those suitable for near-term demonstration (selected by the virtue of relying on an already available number of qubits using a smaller number of entangling pulses; top circuit in the table), those targeted for next-generation machines (roughly, 10 to 15 qubits, second third of the table), and those applying to arbitrary n (bottom third of the table). It is to be noted that for circuits suitable for the implementation over near-term and next-generation machines the advantage in the entangling gate count enabled by the global control is roughly by a factor of 1.39 to 3.67, i.e., it is substantial. The minimal advantage shown is the factor 1.39 for the circuit AQFA-5. This circuit adds two 5-bit numbers and relies on the circuit layers with at most 5 two-qubit gates (see (b) in FIG. 10). Such layers may be too short to show a significant advantage in approximately 2 or 4 GMS gates, and the advantage becomes more pronounced as the number of qubits grows. Specifically, the 20-qubit AQFA-10 already enjoys the optimization from 94 two-qubits local gates down to 53 entangling gates using a mix of global and local control, i.e., by a factor of 1.77.

This disclosure presents various aspects related to the efficient use of a global entangling operator in realizing quantum circuitry of practical interest. This disclosure describes a number of circuit equalities using GMS gates, improving the accessibility of global entangling gates in quantum circuit constructions. Using various versions of the global entangling operator, it has been shown the advantage in implementing certain kinds of stabilizer circuits, number excitation operator, Toffoli-4 gate, Toffoli-n gate, Quantum Fourier Transformation, and Quantum Fourier Adder circuits. In each of the above, the constructions described outperform best known circuitry in the scenario when the control is given by the two-qubit local addressable gates. As such, the control by a global entangling gate (an analog of single instruction, multiple data classical architecture) could be a helpful complement to the control by addressable two-qubit local gates.

Referring now to FIG. 12, illustrated is an example computer device 1200 in accordance with aspects of the disclosure. The computer device 1200 can represent a single computing device, multiple computing devices, or a distributed computing system, for example. The computer device 1200 may be configured as a quantum computer, a classical computer, or a combination of quantum and classical computing functions. For example, the computer device 1200 may be used to process information to generate or determine the various quantum circuit constructions described herein that use global interactions (e.g., that use GMS gates). Moreover, the computer device 1200 may be used as a quantum computer and may implement quantum algorithms based on the quantum circuit constructions described herein that use global interactions. A generic example of a quantum information processing (QIP) system that can implement and use the quantum circuit constructions described herein is illustrated in an example shown in FIG. 14.

In one example, the computer device 1200 may include a processor 1210 for carrying out processing functions associated with one or more of the features described herein. The processor 1210 may include a single or multiple set of processors or multi-core processors. Moreover, the processor 1210 may be implemented as an integrated processing system and/or a distributed processing system. The processor 1210 may include a central processing unit (CPU), a quantum processing unit (QPU), a graphics processing unit (GPU), or combination of those types of processors.

In an example, the computer device 1200 may include a memory 1220 for storing instructions executable by the processor 1210 for carrying out the functions described herein. In an implementation, for example, the memory 1220 may correspond to a computer-readable storage medium that stores code or instructions to perform one or more of the functions or operations described herein. In one example, the memory 1220 may include instructions to perform aspects of a method 1300 described below in connection with FIG. 13.

Further, the computer device 1200 may include a communications component 1230 that provides for establishing and maintaining communications with one or more parties utilizing hardware, software, and services as described herein. The communications component 1230 may carry communications between components on the computer device 1200, as well as between the computer device 1200 and external devices, such as devices located across a communications network and/or devices serially or locally connected to computer device 1200. For example, the communications component 1230 may include one or more buses, and may further include transmit chain components and receive chain components associated with a transmitter and receiver, respectively, operable for interfacing with external devices.

Additionally, the computer device 1200 may include a data store 1240, which can be any suitable combination of hardware and/or software, that provides for mass storage of information, databases, and programs employed in connection with implementations described herein. For example, the data store 1240 may be a data repository for operating system 1260 (e.g., classical OS, or quantum OS). In one implementation, the data store 1240 may include the memory 1220.

The computer device 1200 may also include a user interface component 1250 operable to receive inputs from a user of the computer device 1200 and further operable to generate outputs for presentation to the user or to provide to a different system (directly or indirectly). The user interface component 1250 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 1250 may include one or more output devices, including but not limited to a display, a speaker, a haptic feedback mechanism, a printer, any other mechanism capable of presenting an output to a user, or any combination thereof.

In an implementation, the user interface component 1250 may transmit and/or receive messages corresponding to the operation of the operating system 1260. In addition, the processor 1210 may execute the operating system 1260 and/or applications or programs (e.g., programs to generate or determine quantum circuit constructions using GMS gates), and the memory 1220 or the data store 1240 may store them.

When the computer device 1200 is implemented as part of a cloud-based infrastructure solution, the user interface component 1250 may be used to allow a user of the cloud-based infrastructure solution to remotely interact with the computer device 1200.

FIG. 13 is a flow diagram that illustrates an example of a method 1300 for producing quantum circuit constructions using global interactions in accordance with aspects of this disclosure. In an aspect, the method 1300 may be performed in a computer system such as the computer system 1200 described above, where, for example, the processor 1210, the memory 1220, the data store 1240, and/or the operating system 1260 may be used to perform the functions of the method 1300.

At 1310, the method 1300 includes identifying a quantum circuit.

At 1320, the method 1300 includes determining an equivalent circuit to the quantum circuit, the equivalent circuit constructed using globally addressable operations based on GMS (or global XX or global Ising) gates, where the equivalent circuit has a smaller (e.g., more efficient) gate count than a construction of the quantum circuit using locally addressable operations based on local MS gates. In an aspect, applying ancillary qubits in the construction of the equivalent circuit may be used to further reduce the gate count in the equivalent circuit.

At 1330, the method 1300 includes providing the equivalent circuit to perform one or more quantum algorithms. At 1340 in 1330, the method 1300 includes providing the equivalent circuit to perform one or more quantum algorithms by generating a netlist with information of the equivalent circuit or a hardware description language representation of the equivalent circuit.

In an aspect of the method 1300, the GMS gates involve m qubits out of an n-qubit quantum circuit, where $2 < m \leq n$. That is, a GMS gate need not refer to a gate where all qubits (e.g., all n qubits) in the system are involved in the gate. The GMS gate may instead refer to a gate in which a number m of qubits are involved, where $m \leq n$. For the case where $m=2$, these are the local pair-wise MS gates, so the non-trivial cases of interest are those for which $m > 2$ (e.g., $2 < m \leq n$).

In an aspect of the method 1300, the quantum circuit from which an equivalent circuit is determined by using GMS gates can be one or more of a stabilizer circuit, a number excitation operator, a Toffoli-4 gate, a Toffoli-n gate, a QFT circuit, or a QFA circuit.

In another aspect of the method 1300, the GMS gates may have the same rotation angle $\chi_{ij}$, where i and j correspond to the $i^{th}$ and $j^{th}$ qubits.

In yet another aspect of the method 1300, the GMS gates may have different rotation angles $\chi_{ij}$, where i and j correspond to the $i^{th}$ and $j^{th}$ qubits.

In another aspect of the method 1300, the equivalent circuit constructed using globally addressable operations based on the GMS gates is configured to be implemented as a superconducting circuit.

In another aspect of the method 1300, the equivalent circuit constructed using globally addressable operations based on the GMS gates is configured to be implemented based on trapped ion technology.

In another aspect of the method 1300, the equivalent circuit constructed using globally addressable operations based on the GMS gates corresponds to a single instruction multiple data quantum computing (SIMD QC) hardware architecture.

In connection with the method 1300 the quantum circuit from which an equivalent circuit is determined by using GMS gates can be constructed or implemented using the computer device 1200 in FIG. 12 or a QIP system, such as the one described below in connection with FIG. 14.

FIG. 14 is a block diagram that illustrates an example of a QIP system 1400 in accordance with aspects of this disclosure. The QIP system 1400 may also be referred to as a quantum computing system, a computer device, or the like. In an aspect, the QIP system 1400 may correspond to portions of a quantum computer implementation of the computing device 1200 in FIG. 12.

The QIP system 1400 can include a source 1460 that provides atomic species to a chamber 1450 having an ion trap 1470 that traps the atomic species once ionized by an optical controller 1420. Optical sources 1430 in the optical controller 1420 may include one or more laser sources that can be used for ionization of the atomic species, control (e.g., phase control) of the atomic ions, and for fluorescence of the atomic ions that can be monitored and tracked by image processing algorithms operating in an imaging system 1440 in the optical controller 1420. The imaging system 1440 can include a high resolution imager (e.g., CCD camera) for monitoring the atomic ions while they are being provided to the ion trap 1470 (e.g., for counting) or after they have been provided to the ion trap 1470 (e.g., for monitoring the atomic ions states). In an aspect, the imaging system 1440 can be implemented separate from the optical controller 1420, however, the use of fluorescence to detect, identify, and label atomic ions using image processing algorithms may need to be coordinated with the optical controller 1420.

The QIP system 1400 may also include an algorithms component 1410 that may operate with other parts of the QIP system 1400 (not shown) to perform quantum algorithms that determine, construct, and/or implement at least some of the quantum circuit constructions that use global interactions as described above. As such, the algorithms component 1410 may provide instructions to various components of the QIP system 1400 (e.g., to the optical controller 1420) to enable the implementation of quantum circuits, or their equivalents, such as the ones described herein that have efficient gate constructions by using GMS gates.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method for producing quantum circuit constructions using global interactions, comprising:
   identifying a quantum circuit;
   determining an equivalent circuit to the quantum circuit, the equivalent circuit constructed using globally addressable operations based on global Mølmer-Sørensen (GMS) gates, the equivalent circuit having a smaller gate count than a construction of the quantum circuit using locally addressable operations based on local Mølmer-Sørensen (MS) gates; and
   providing the equivalent circuit to perform one or more quantum algorithms.

2. The method of claim 1, wherein the GMS gates involve m qubits out of an n-qubit quantum circuit, and wherein $2 < m \leq n$.

3. The method of claim 1, wherein the quantum circuit is a stabilizer circuit.

4. The method of claim 1, wherein the quantum circuit is a number excitation operator.

5. The method of claim 1, wherein the quantum circuit is a Toffoli-4 gate.

6. The method of claim 1, wherein the quantum circuit is a Toffoli-n gate.

7. The method of claim 1, wherein the quantum circuit is a quantum Fourier transformation (QFT) circuit.

8. The method of claim 1, wherein the quantum circuit is a quantum Fourier adder (QFA) circuit.

9. The method of claim 1, further comprising applying ancillary qubits to construct the equivalent circuit to further reduce the gate count in the equivalent circuit.

10. The method of claim 1, wherein the GMS gates have a same rotation angle $\chi_{ij}$, where i and j correspond to the $i^{th}$ and $j^{th}$ qubits.

11. The method of claim 1, wherein the GMS gates have different rotation angles $\chi_{ij}$, where i and j correspond to the $i^{th}$ and $j^{th}$ qubits.

12. The method of claim 1, wherein providing the equivalent circuit to perform one or more quantum algorithms includes generating a netlist with information of the equivalent circuit or a hardware description language representation of the equivalent circuit.

13. The method of claim 1, further comprising configuring the equivalent circuit constructed using globally addressable operations based on the GMS gates to be implemented as a superconducting circuit.

14. The method of claim 1, further comprising configuring the equivalent circuit constructed using globally addressable operations based on the GMS gates to be implemented based on trapped ion technology.

15. The method of claim 1, wherein the equivalent circuit constructed using globally addressable operations based on the GMS gates corresponds to a single instruction multiple data quantum computing (SIMD QC) hardware architecture.

16. A computer-readable medium storing code with instructions executable by a processor for producing quantum circuit constructions using global interactions, comprising:
 code for identifying a quantum circuit;
 code for determining an equivalent circuit to the quantum circuit, the equivalent circuit constructed using globally addressable operations based on global Mølmer-Sørensen (GMS) gates, the equivalent circuit having a smaller gate count than a construction of the quantum circuit using locally addressable operations based on local Mølmer-Sørensen (MS) gates; and
 code for providing the equivalent circuit to perform one or more quantum algorithms.

17. The computer-readable medium of claim 16, wherein the GMS gates involve m qubits out of an n-qubit quantum circuit, and wherein 2<m≤n.

18. The computer-readable medium of claim 16, wherein the quantum circuit is one or more of:
 a stabilizer circuit,
 a number excitation operator,
 a Toffoli-4 gate,
 a Toffoli-n gate,
 a quantum Fourier transformation (QFT) circuit, or
 a quantum Fourier adder (QFA) circuit.

19. The computer-readable medium of claim 16, further comprising code for applying ancillary qubits to construct the equivalent circuit to further reduce the gate count in the equivalent circuit.

20. The computer-readable medium of claim 16, wherein the GMS gates have a same rotation angle $\chi_{ij}$, where i and j correspond to the $i^{th}$ and $j^{th}$ qubits.

21. The computer-readable medium of claim 16, wherein the GMS gates have different rotation angles $\chi_{ij}$, where i and j correspond to the $i^{th}$ and $j^{th}$ qubits.

22. The computer-readable medium of claim 16, wherein the code for providing the equivalent circuit to perform one or more quantum algorithms includes code for generating a netlist with information of the equivalent circuit or a hardware description language representation of the equivalent circuit.

23. The computer-readable medium of claim 16, wherein the equivalent circuit constructed using globally addressable operations based on the GMS gates is:
 configured to be implemented as a superconducting circuit, or
 configured to be implemented based on trapped ion technology.

24. The computer-readable medium of claim 16, wherein the equivalent circuit constructed using globally addressable operations based on the GMS gates corresponds to a single instruction multiple data quantum computing (SIMD QC) hardware architecture.

25. A quantum information processing (QIP) system, comprising:
 a first component including trapped atomic ions; and
 a second component configured to implement quantum algorithms based on one or more quantum circuits using the trapped atomic ions, wherein the second component is further configured to implement equivalent circuits to the one or more quantum circuits, the equivalent circuits being constructed using globally addressable operations based on global Mølmer-Sørensen (GMS) gates, and the equivalent circuits having a smaller gate count than a construction of the respective one or more quantum circuits using locally addressable operations based on local Mølmer-Sørensen (MS) gates.

26. The QIP system of claim 25, wherein the GMS gates involve m qubits out of an n-qubit quantum circuit, and wherein 2<m≤n.

27. The QIP system of claim 25, wherein the one or more quantum circuits include one or more of:
 a stabilizer circuit,
 a number excitation operator,
 a Toffoli-4 gate,
 a Toffoli-n gate,
 a quantum Fourier transformation (QFT) circuit, or
 a quantum Fourier adder (QFA) circuit.

28. The QIP system of claim 25, wherein the equivalent circuits are constructed by applying ancillary qubits to further reduce the gate count in the equivalent circuits.

29. The QIP system of claim 25, wherein the equivalent circuits constructed using globally addressable operations based on the GMS gates are:
 implemented as a superconducting circuit, or
 implemented based on trapped ion technology.

30. The QIP system of claim 25, wherein the equivalent circuits constructed using globally addressable operations based on the GMS gates corresponds to a single instruction multiple data quantum computing (SIMD QC) hardware architecture.

31. The QUP system of claim 25, wherein the second component is further configured to construct the equivalent circuits to perform one or more quantum algorithms that include generating a netlist with information of the equivalent circuits or a hardware description language representation of the equivalent circuits.

* * * * *

UNITED STATES PATENT AND TRADEMARK OFFICE
CERTIFICATE OF CORRECTION

| | |
|---|---|
| PATENT NO. | : 11,562,277 B2 |
| APPLICATION NO. | : 16/234112 |
| DATED | : January 24, 2023 |
| INVENTOR(S) | : Yunseong Nam and Dmitri Maslov |

It is certified that error appears in the above-identified patent and that said Letters Patent is hereby corrected as shown below:

On the Title Page

Item (71) Applicant should only list -- University of Maryland, College Park --.

Signed and Sealed this
Fifth Day of September, 2023

Katherine Kelly Vidal
*Director of the United States Patent and Trademark Office*